(12) United States Patent
Chang et al.

(10) Patent No.: US 12,170,325 B2
(45) Date of Patent: Dec. 17, 2024

(54) METHOD OF MANUFACTURING A SEMICONDUCTOR DEVICE AND A SEMICONDUCTOR DEVICE

(71) Applicant: TAIWAN SEMICONDUCTOR MANUFACTURING COMPANY, LTD., Hsinchu (TW)

(72) Inventors: Cheng-Wei Chang, Taipei (TW); Shahaji B. More, Hsinchu (TW); Yi-Ying Liu, Hsinchu (TW); Yueh-Ching Pai, Taichung (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 18/231,419

(22) Filed: Aug. 8, 2023

(65) Prior Publication Data
US 2023/0378316 A1    Nov. 23, 2023

Related U.S. Application Data

(62) Division of application No. 17/577,952, filed on Jan. 18, 2022, now Pat. No. 11,973,124.
(Continued)

(51) Int. Cl.
*H01L 29/66* (2006.01)
*H01L 21/28* (2006.01)
*H01L 21/285* (2006.01)

(52) U.S. Cl.
CPC .. *H01L 29/66507* (2013.01); *H01L 21/28052* (2013.01); *H01L 21/28518* (2013.01); *H01L 29/66598* (2013.01)

(58) Field of Classification Search
CPC ......... H01L 29/66507; H01L 21/28052; H01L 21/28518; H01L 29/66598;
(Continued)

(56) References Cited

U.S. PATENT DOCUMENTS 9,105,490 B2    8/2015    Wang et al.
9,236,267 B2    1/2016    De et al.
(Continued)

FOREIGN PATENT DOCUMENTS

| DE | 10 2019 121 278 A1 | 2/2021 |
| KR | 10-2016-0097869 A | 8/2016 |
| KR | 10-2019-0056886 A | 5/2019 |

OTHER PUBLICATIONS

Non-Final Office Action issued in U.S. Appl. No. 17/577,952, dated Apr. 13, 2023.

*Primary Examiner* — Mohammad A Rahman
(74) *Attorney, Agent, or Firm* — STUDEBAKER & BRACKETT PC

(57) ABSTRACT

In method of manufacturing a semiconductor device, a source/drain epitaxial layer is formed, one or more dielectric layers are formed over the source/drain epitaxial layer, an opening is formed in the one or more dielectric layers to expose the source/drain epitaxial layer, a first silicide layer is formed on the exposed source/drain epitaxial layer, a second silicide layer different from the first silicide layer is formed on the first silicide layer, and a source/drain contact is formed over the second silicide layer.

20 Claims, 35 Drawing Sheets

Related U.S. Application Data

(60) Provisional application No. 63/275,696, filed on Nov. 4, 2021.

(58) Field of Classification Search
CPC ....... H01L 21/76831; H01L 21/823431; H01L 29/66439; H01L 29/165; H01L 29/41766; H01L 29/42392; H01L 29/78696; H01L 29/66545; H01L 21/76897; H01L 21/76855; H01L 21/76843; H01L 29/665; H01L 29/6656; H01L 21/823475; H01L 21/823412; H01L 21/823418; H01L 29/0673; H01L 29/0847; H01L 29/4933; H01L 29/4941; H01L 29/495; H01L 29/4975; H01L 21/02425; H01L 21/28061; H01L 21/28097; H01L 21/32051; H01L 21/32053
See application file for complete search history.

(56) References Cited

U.S. PATENT DOCUMENTS

| | | |
|---|---|---|
| 9,236,300 B2 | 1/2016 | Liaw |
| 9,406,804 B2 | 8/2016 | Huang et al. |
| 9,443,769 B2 | 9/2016 | Wang et al. |
| 9,520,482 B1 | 12/2016 | Chang et al. |
| 9,548,366 B1 | 1/2017 | Ho et al. |
| 9,576,814 B2 | 2/2017 | Wu et al. |
| 9,831,183 B2 | 11/2017 | Lin et al. |
| 9,859,386 B2 | 1/2018 | Ho et al. |
| 10,276,675 B2 | 4/2019 | Choi et al. |
| 10,964,791 B2 | 3/2021 | Hwang et al. |
| 11,348,839 B2 | 5/2022 | Loh et al. |
| 2015/0228745 A1 | 8/2015 | Breil et al. |
| 2018/0374749 A1* | 12/2018 | Wong ................ H01L 21/76876 |

* cited by examiner

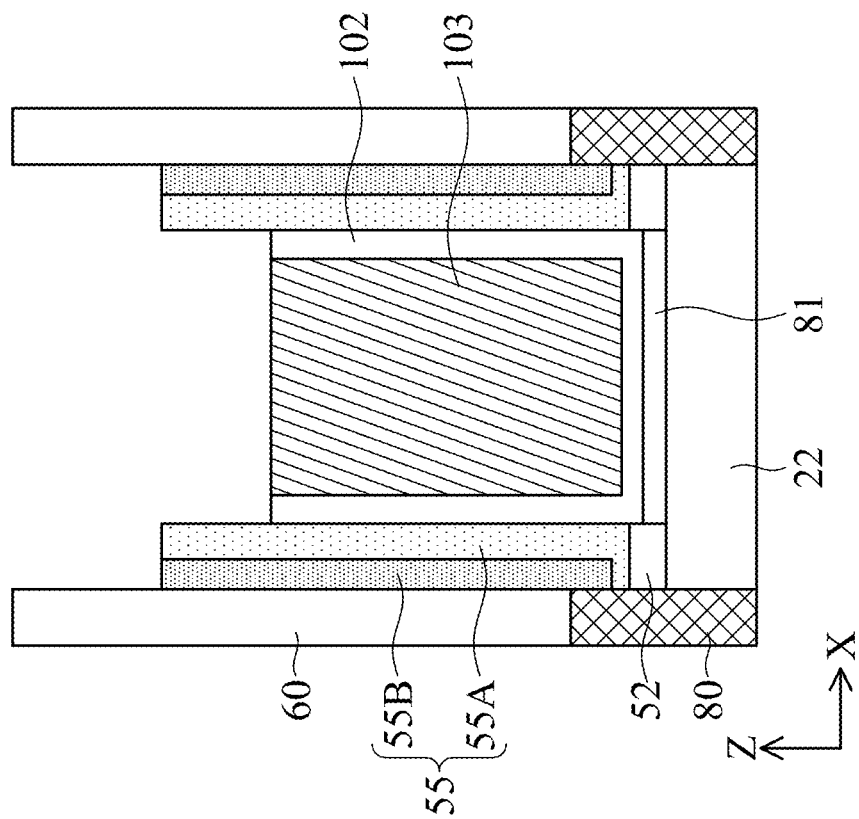
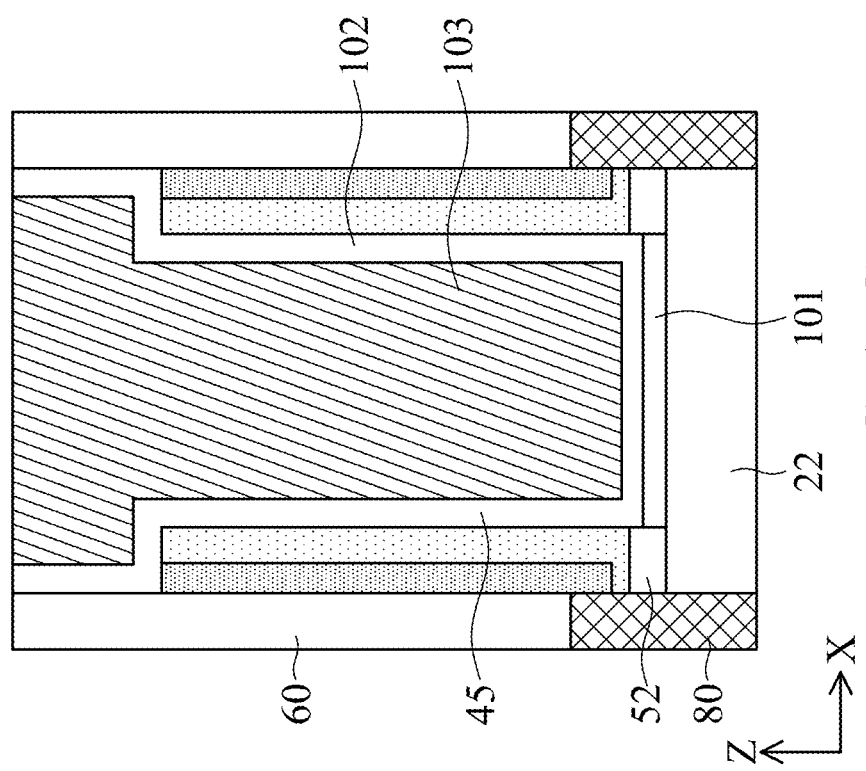
FIG. 17C
FIG. 17D

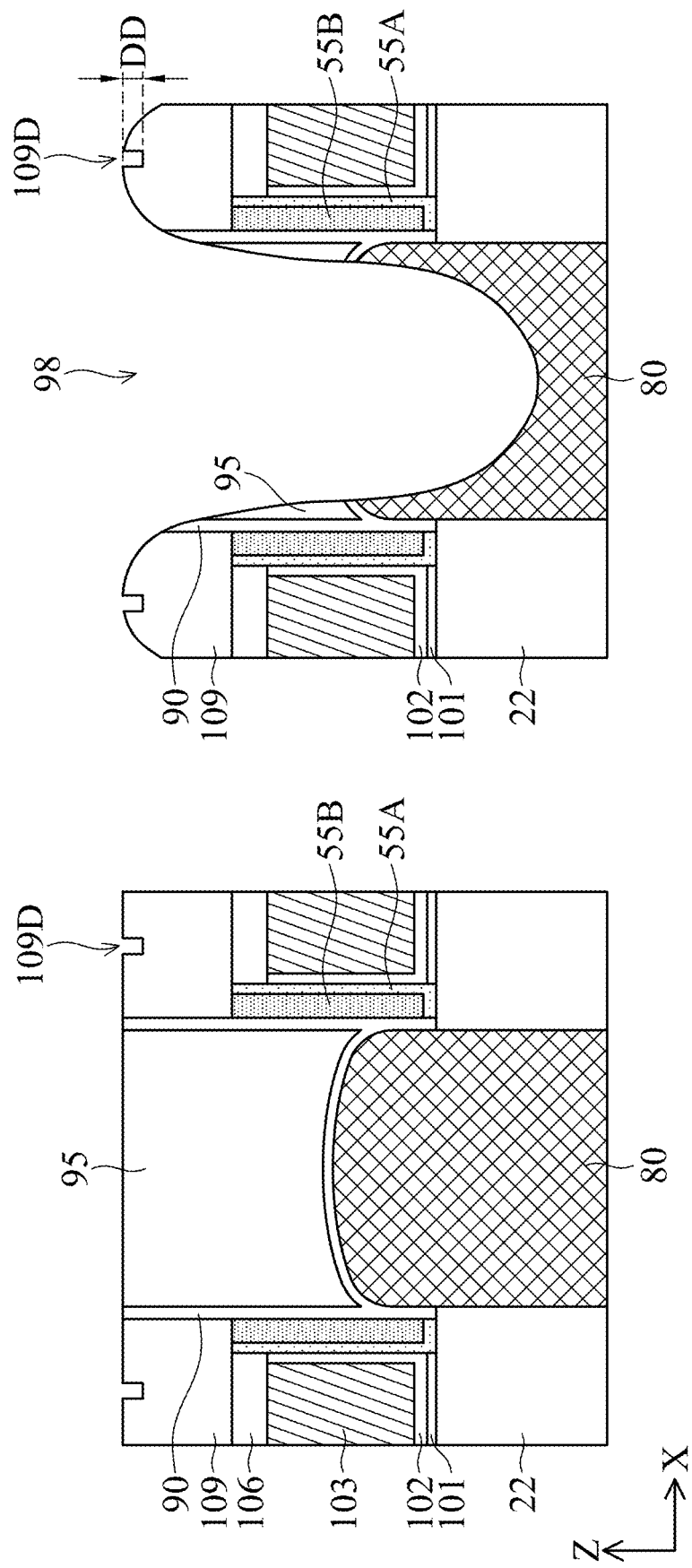

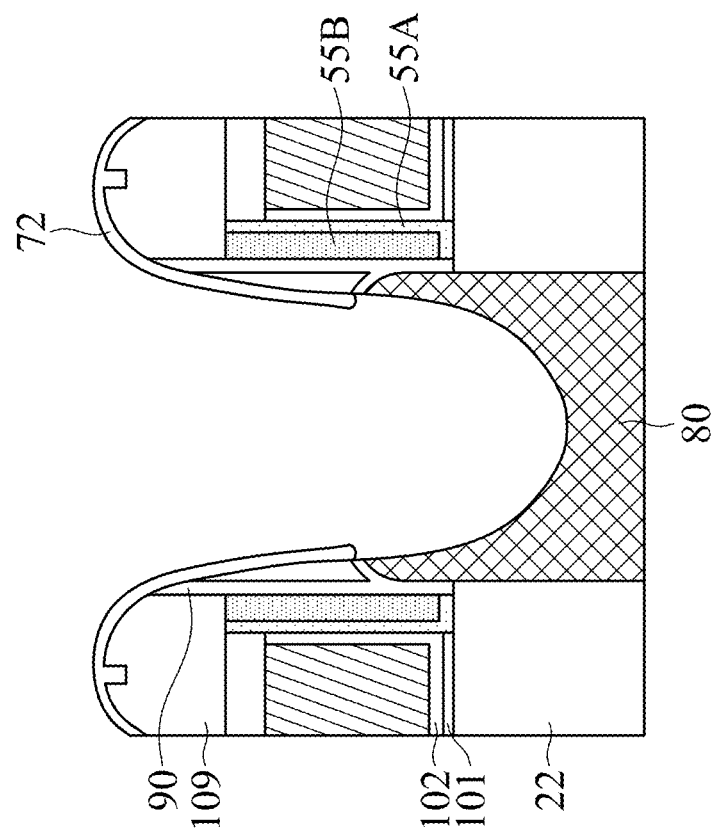
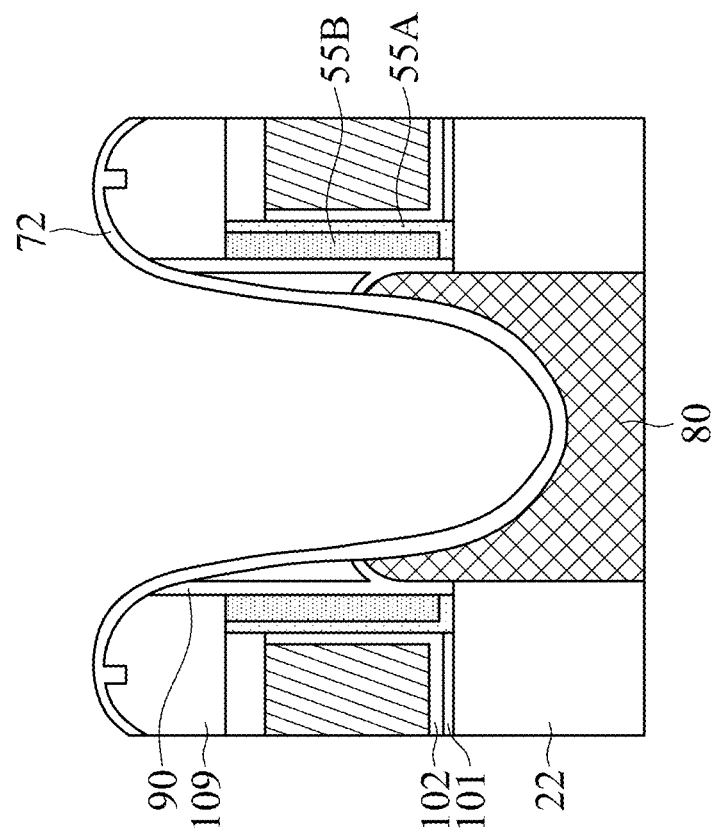

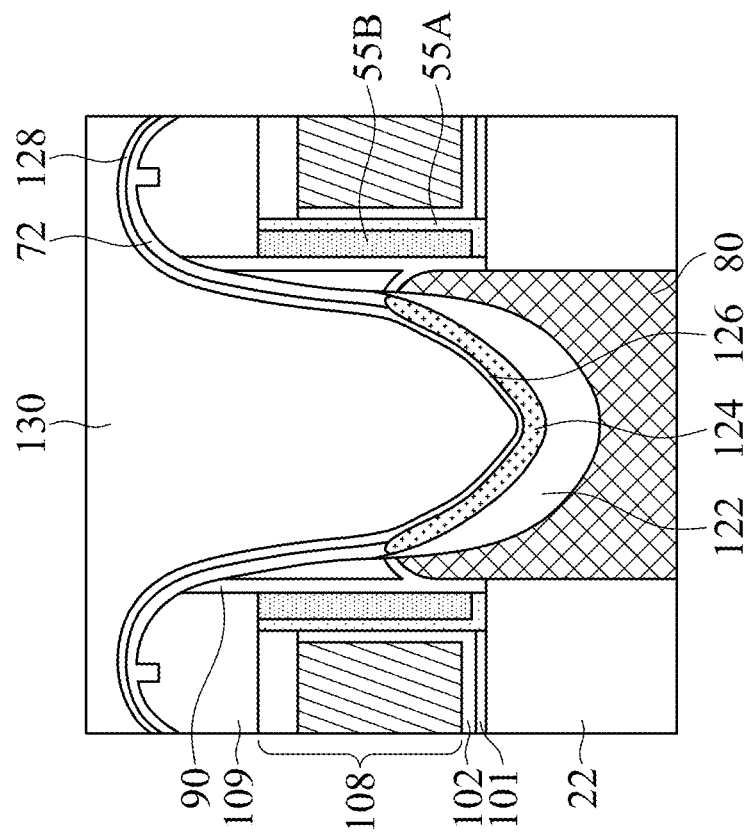
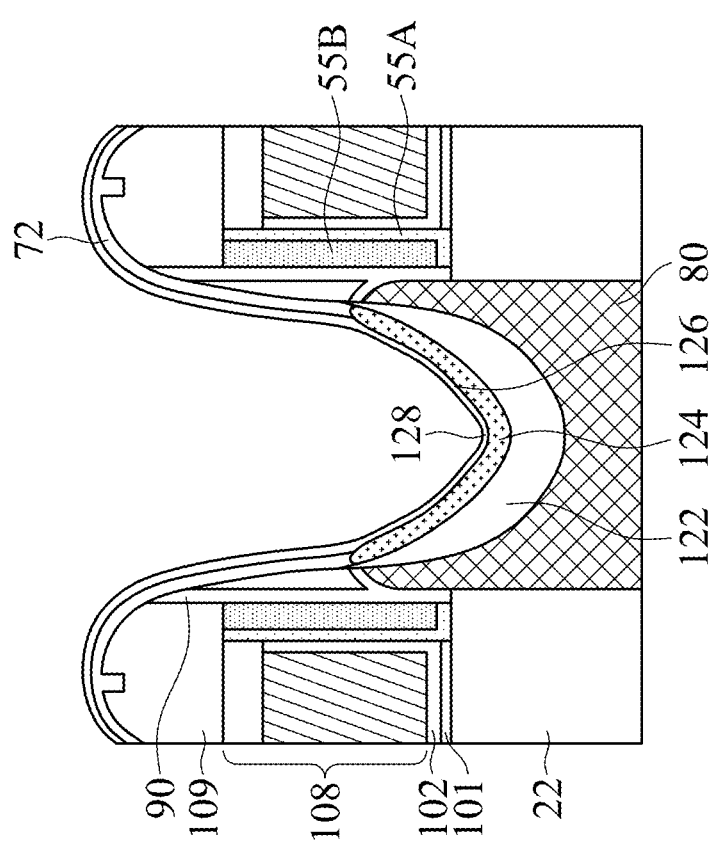

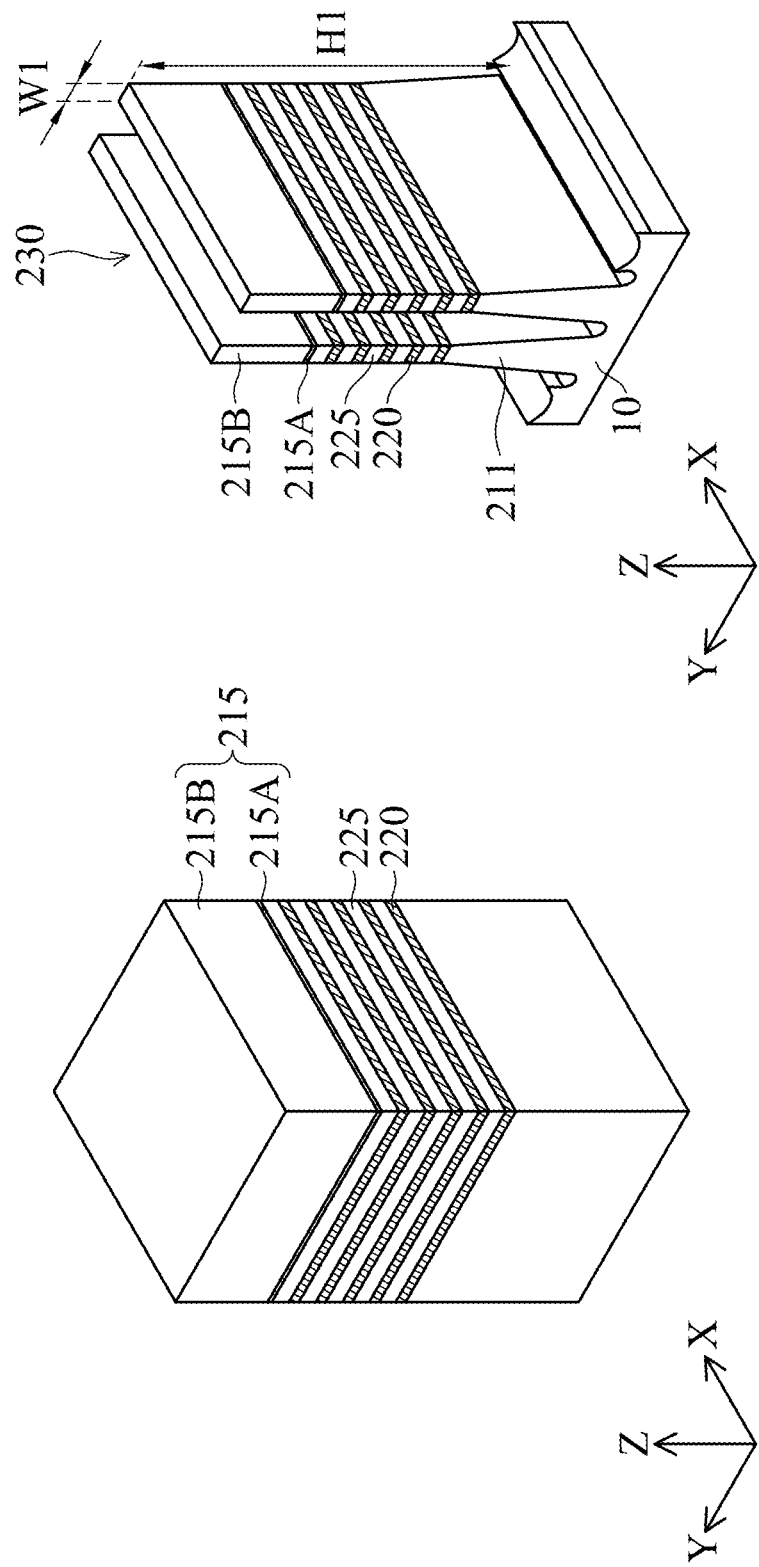

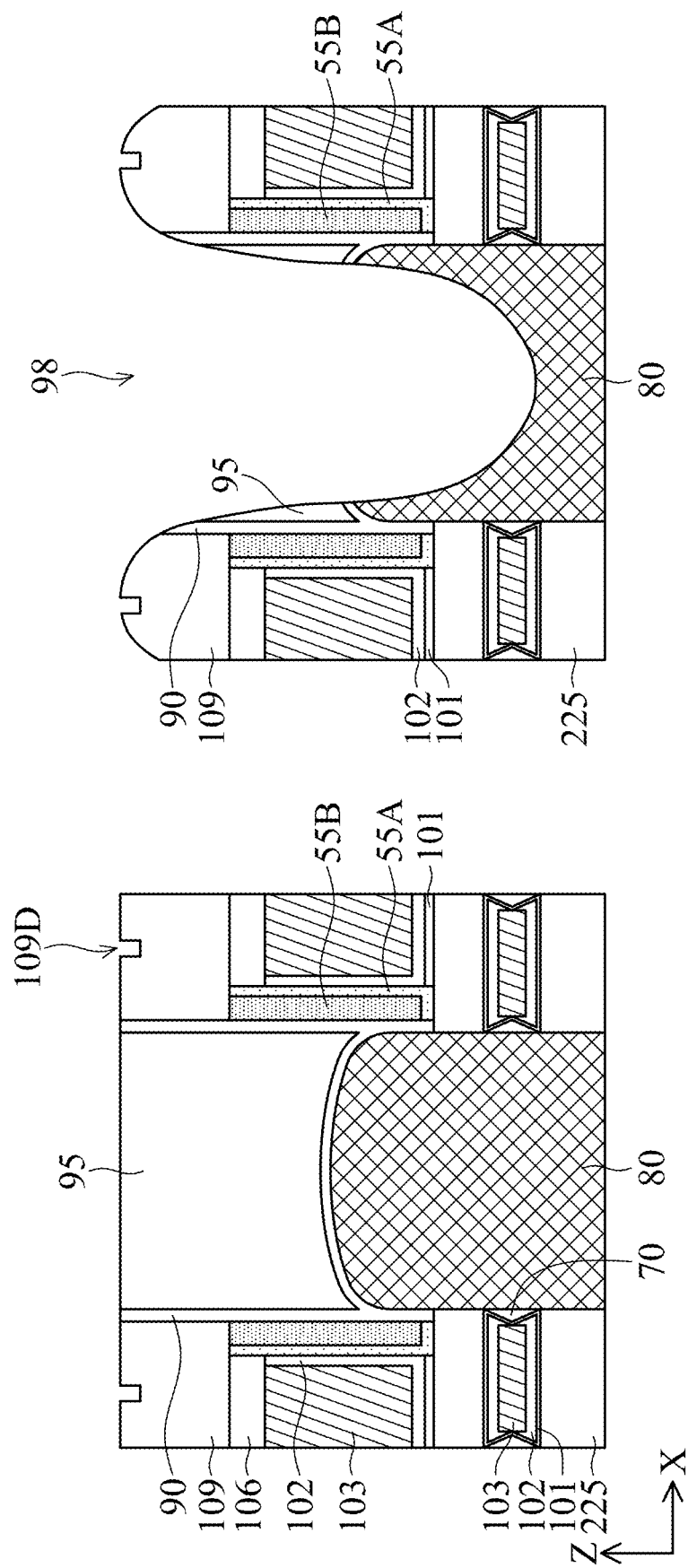

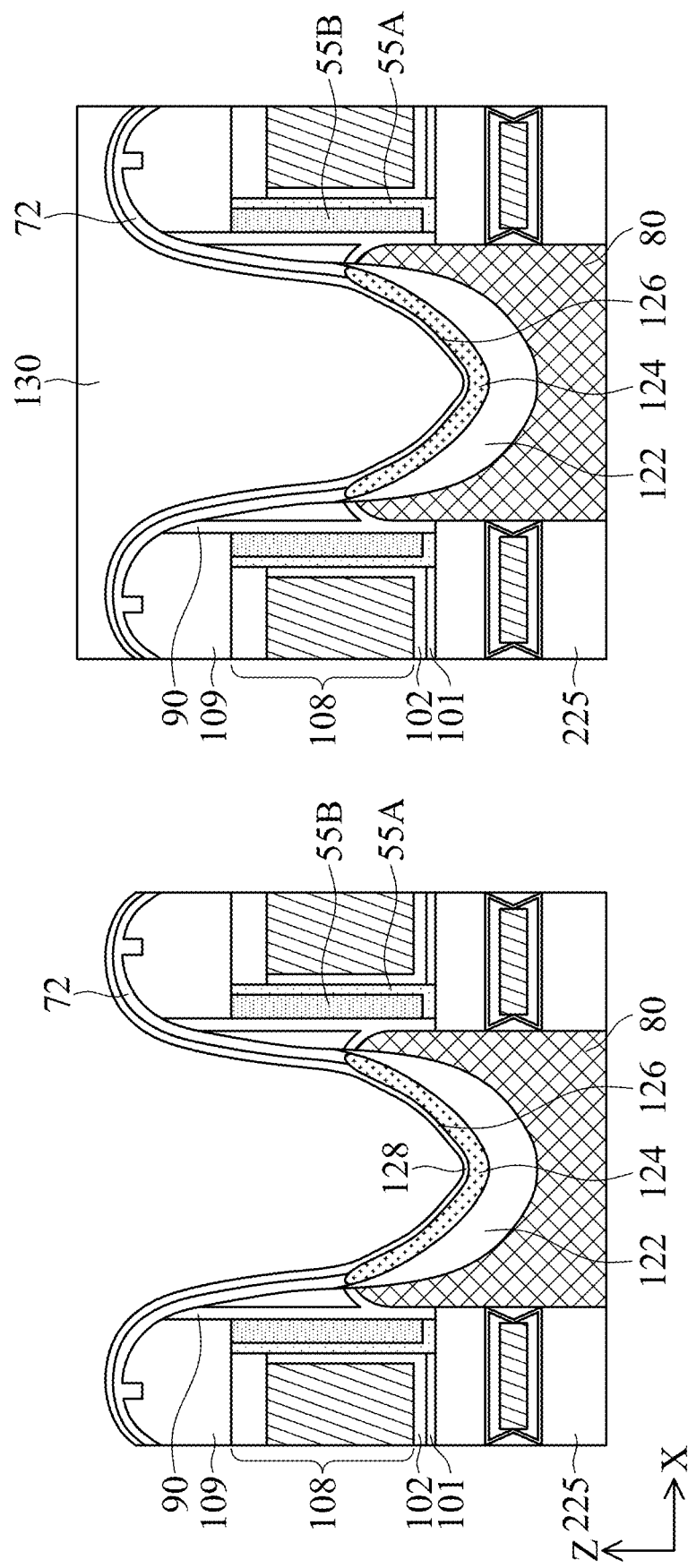

METHOD OF MANUFACTURING A SEMICONDUCTOR DEVICE AND A SEMICONDUCTOR DEVICE

RELATED APPLICATIONS

This application is a divisional of U.S. patent application Ser. No. 17/577,952 filed Jan. 18, 2022, now U.S. Pat. No. 11,973,124, which claims priority to U.S. Provisional Patent Application No. 63/275,696 filed on Nov. 4, 2021, the entire content of each of which is incorporated herein by reference.

BACKGROUND

As the semiconductor industry has progressed into nanometer technology process nodes in pursuit of higher device density, higher performance, and lower costs, challenges from both fabrication and design issues have resulted in the development of three-dimensional designs, such as a multi-gate field effect transistor (FET), including a fin FET (FinFET) and a gate-all-around (GAA) FET. A source/drain region of these FETs includes one or more layers of epitaxial semiconductor materials, and a source/drain contact is formed over the source/drain epitaxial layer with a silicide layer therebetween.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 17A, 17B, 17C, 17D, 17E and 17F show various stages of a sequential process for manufacturing a semiconductor device according to an embodiment of the present disclosure.

FIGS. 18A, 18B, 18C, 18D, 18E, 18F, 18G and 18H show various stages of a sequential process for manufacturing a semiconductor device according to an embodiment of the present disclosure.

FIG. 19 shows one the stages of a sequential process for manufacturing a semiconductor device according to an embodiment of the present disclosure.

FIG. 20 shows one of the stages of a sequential process for manufacturing a semiconductor device according to an embodiment of the present disclosure.

FIGS. 33A, 33B, 33C, 33D, 33E, 33F, 33G and 33H show various stages of a sequential process for manufacturing a semiconductor device according to an embodiment of the present disclosure.

DETAILED DESCRIPTION

Figure 2:
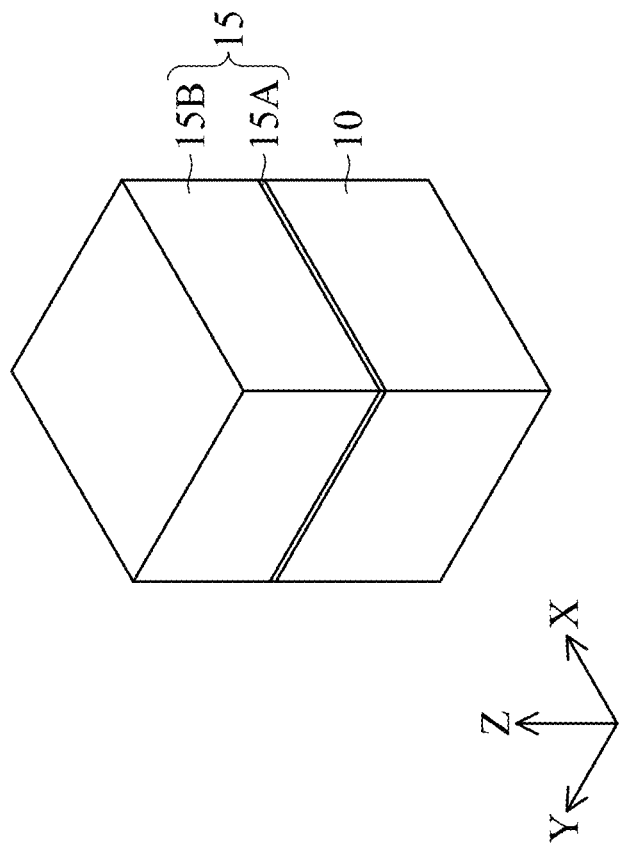
FIG. 2 shows one of the stages of a sequential process for manufacturing a semiconductor device according to an embodiment of the present disclosure.

It is to be understood that the following disclosure provides many different embodiments, or examples, for implementing different features of the invention. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. In addition, the term "made of" may mean either "comprising" or "consisting of." The numerical values, ranges, dimensions, material, processes, configurations and/or arrangements described below are mere examples and not limited to those disclosed, and other values, ranges, dimensions, material, processes, configurations and/or arrangements may be within the scope of the present disclosure, unless otherwise explained.

Reducing resistance between or at a source/drain epitaxial layer and a source/drain contact is one of the key factors in an advanced node of a semiconductor device and its manufacturing process. When dimensions of a device reach to a sub-10 nm scale the source-drain sheet resistance of the device becomes large (so called, a linewidth dependent sheet resistance problem). Therefore, to enhance device performance, a silicidation technique, which reduces source-drain sheet/contact resistance, becomes indispensable. As a silicide material, $TiSi_x$ (titanium silicide) is frequently used for the silicidation technique. However, titanium silicide has a problem of agglomeration caused by thermal processes during a CMOS fabrication process, which increases the sheet resistance.

In the present disclosure, $NiSi_x$ (nickel silicide) and/or Ni-based silicide are used as a silicide material for reducing contact and/or sheet resistance between or at a source/drain epitaxial layer and a source/drain contact. Ni silicide has a contact resistance to a p-type metal oxide semiconductor (PMOS) device, smaller than a contact resistance of Ti silicide due to the Schottky barrier height of Ni silicide to a SiGe:B epitaxial layer of a PMOS device that is lower than the Schottky barrier height of Ti silicide to the PMOS. In contrast, in an NMOS device, the higher Schottky barrier height of the Ni silicide to a Si:P epitaxial layer can reduce the contact resistance.

FIGS. 1-18H show a sequential process for manufacturing a Fin FET device according to an embodiment of the present disclosure. It is understood that additional operations can be provided before, during, and after processes shown by FIGS. 1-18H, and some of the operations described below can be replaced or eliminated, for additional embodiments of the method. The order of the operations/processes may be interchangeable.

Figure 1:
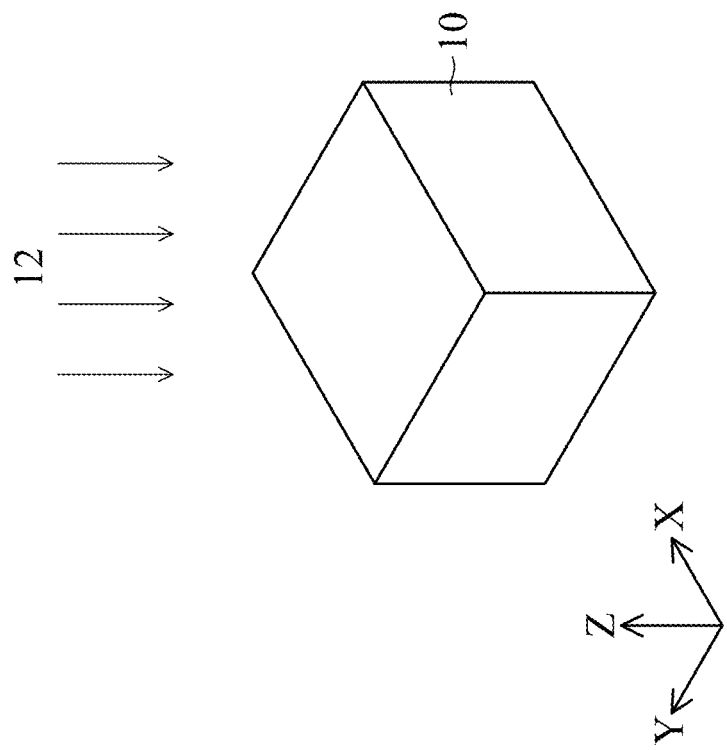
FIG. 1 shows one of the stages of a sequential process for manufacturing a semiconductor device according to an embodiment of the present disclosure.

As shown in FIG. 1, impurity ions (dopants) 12 are implanted into a silicon substrate 10 to form a well region. The ion implantation is performed to prevent a punch-through effect.

In one embodiment, substrate 10 includes a single crystalline semiconductor layer on at least it surface portion. The substrate 10 may comprise a single crystalline semiconductor material such as, but not limited to Si, Ge, SiGe, GaAs, InSb, GaP, GaSb, InAlAs, InGaAs, GaSbP, GaAsSb and InP. In this embodiment, the substrate 10 is made of Si.

The substrate 10 may include in its surface region, one or more buffer layers (not shown). The buffer layers can serve to gradually change the lattice constant from that of the substrate to that of the source/drain regions. The buffer layers may be formed from epitaxially grown single crystalline semiconductor materials such as, but not limited to Si, Ge, GeSn, SiGe, GaAs, InSb, GaP, GaSb, InAlAs, InGaAs, GaSbP, GaAsSb, GaN, GaP, and InP. In a particular embodiment, the substrate 10 comprises silicon germanium (SiGe) buffer layers epitaxially grown on the silicon substrate 10. The germanium concentration of the SiGe buffer layers may increase from 30 atomic % germanium for the bottom-most buffer layer to 70 atomic % germanium for the top-most buffer layer.

The substrate 10 may include various regions that have been suitably doped with impurities (e.g., p-type or n-type conductivity). The dopants 12 are, for example boron ($BF_2$) for an n-type Fin FET and phosphorus for a p-type Fin FET.

In FIG. 2, a mask layer 15 is formed over the substrate 10. In some embodiments, the mask layer 15 includes a first mask layer 15A and a second mask layer 15B. In some embodiments, the first mask layer 15A is made of silicon nitride and the second mask layer 15B is made of a silicon oxide. In other embodiments, the first mask layer 15A is made of silicon oxide and the second mask layer 15B is made of silicon nitride (SiN). The first and second mask layers are formed by chemical vapor deposition (CVD), including low pressure CVD (LPCVD) and plasma enhanced CVD (PECVD), physical vapor deposition (PVD), atomic layer deposition (ALD), or other suitable process. The mask layer 15 is patterned into a mask pattern by using patterning operations including photo-lithography and etching.

Figure 3:
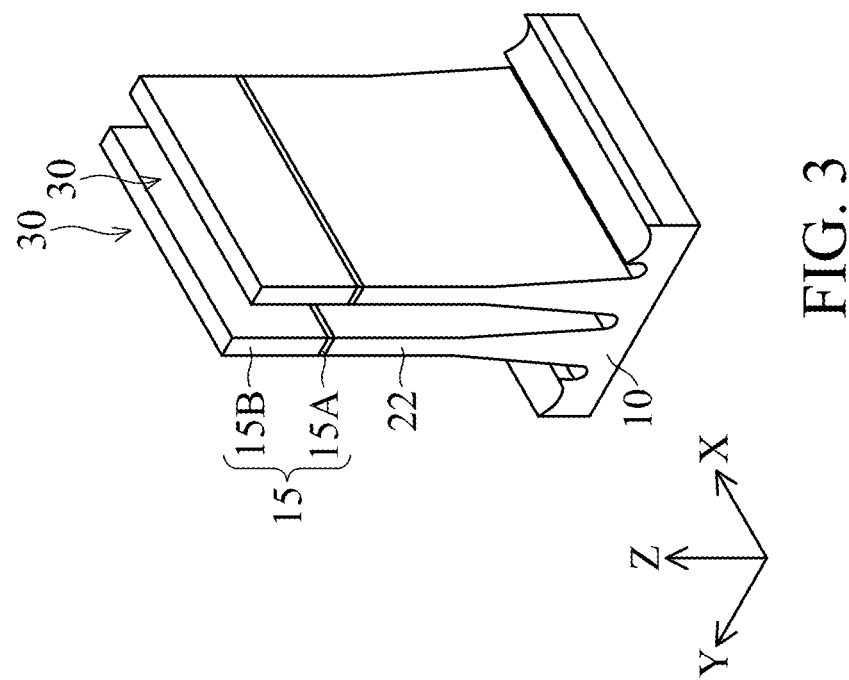
FIG. 3 shows one of the stages of a sequential process for manufacturing a semiconductor device according to an embodiment of the present disclosure.

Next, as shown in FIG. 3, the substrate 10 is patterned by using the patterned mask layer 15 into fin structures 30 extending in the X direction. In FIG. 3, two fin structures 30 are arranged in the Y direction. But the number of the fin structures is not limited to two, and may be as small as one and three or more. In some embodiments, one or more dummy fin structures are formed on both sides of the fin structures 30 to improve pattern fidelity in the patterning operations.

The fin structures 30 may be patterned by any suitable method. For example, the fin structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fin structures.

After the fin structure is formed, an insulating material layer 41 including one or more layers of insulating material is formed over the substrate so that the fin structures are fully embedded in the insulating layer. The insulating material for the insulating layer 41 may include silicon oxide, silicon nitride, silicon oxynitride (SiON), SiOCN, SiCN, fluorine-doped silicate glass (FSG), or a low-k dielectric material, formed by LPCVD (low pressure chemical vapor deposition), plasma-CVD or flowable CVD. An anneal operation may be performed after the formation of the insulating layer. Then, a planarization operation, such as a chemical mechanical polishing (CMP) method and/or an etch-back method, is performed such that the upper surface of the fin structure 22 (semiconductor portion) is exposed from the insulating material layer 41 as shown in FIG. 4.

Figure 4:
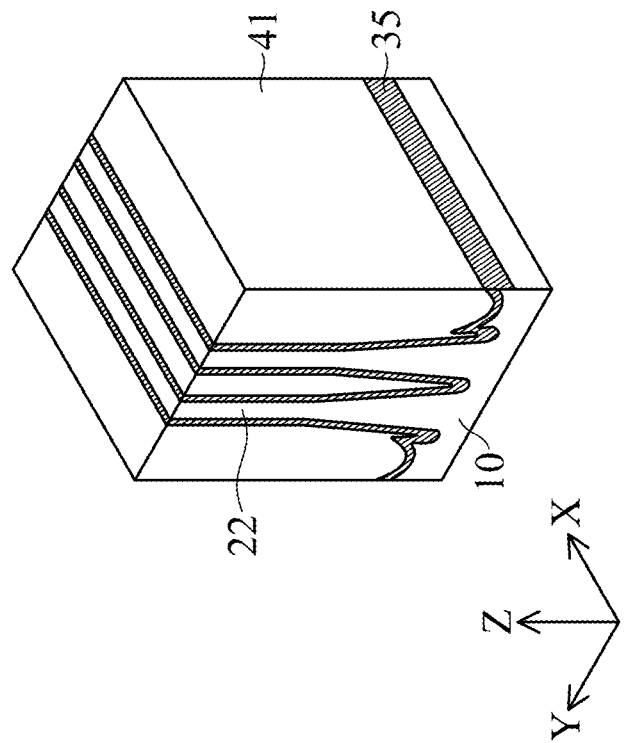
FIG. 4 shows one of the stages of a sequential process for manufacturing a semiconductor device according to an embodiment of the present disclosure.

In some embodiments, one or more liner layers 35 are formed over the structure of FIG. 3 before forming the insulating material layer 41, as shown FIG. 4. The liner layer 35 includes one or more of silicon nitride, SiON, SiCN, SiOCN, and silicon oxide.

Figure 5:
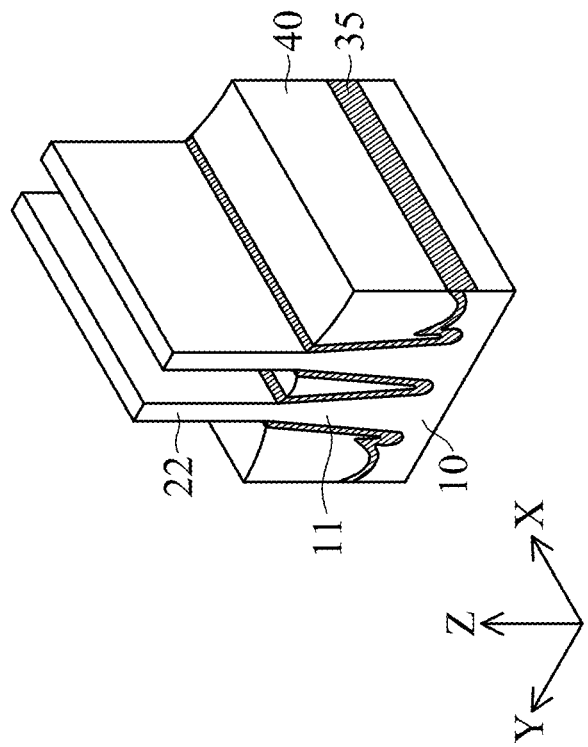
FIG. 5 shows one of the stages of a sequential process for manufacturing a semiconductor device according to an embodiment of the present disclosure.

Then, as shown in FIG. 5, the insulating material layer 41 is recessed to form an isolation insulating layer 40 so that the upper portions of the fin structures 22 are exposed. With this operation, the fin structures 22 are electrically separated from each other by the isolation insulating layer 40, which is also called a shallow trench isolation (STI). The lower portion 11 of the fin structure 22 is embedded in the isolation insulating layer 40.

Figure 6:
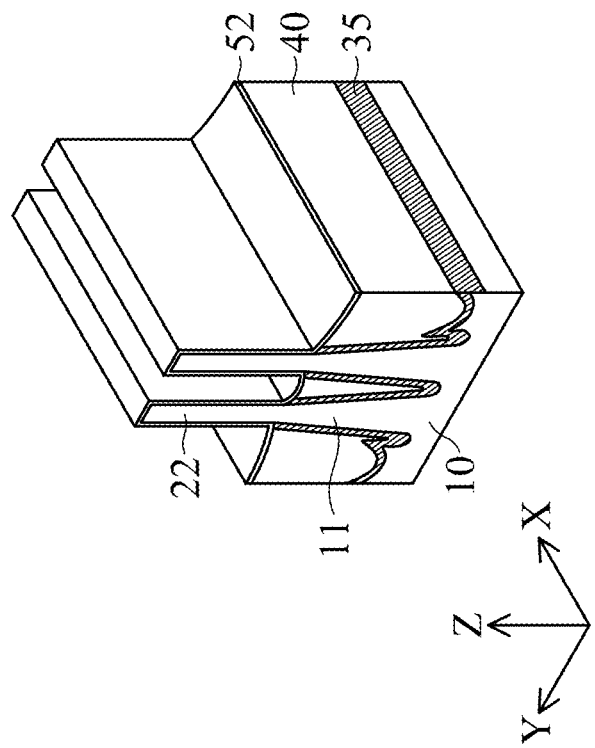
FIG. 6 shows one of the stages of a sequential process for manufacturing a semiconductor device according to an embodiment of the present disclosure.

After the isolation insulating layer 40 is formed, a sacrificial gate dielectric layer 52 is formed, as shown in FIG. 6. The sacrificial gate dielectric layer 52 includes one or more layers of insulating material, such as a silicon oxide-based material. In one embodiment, silicon oxide formed by CVD is used. The thickness of the sacrificial gate dielectric layer 52 is in a range from about 1 nm to about 5 nm in some embodiments.

Figure 7:
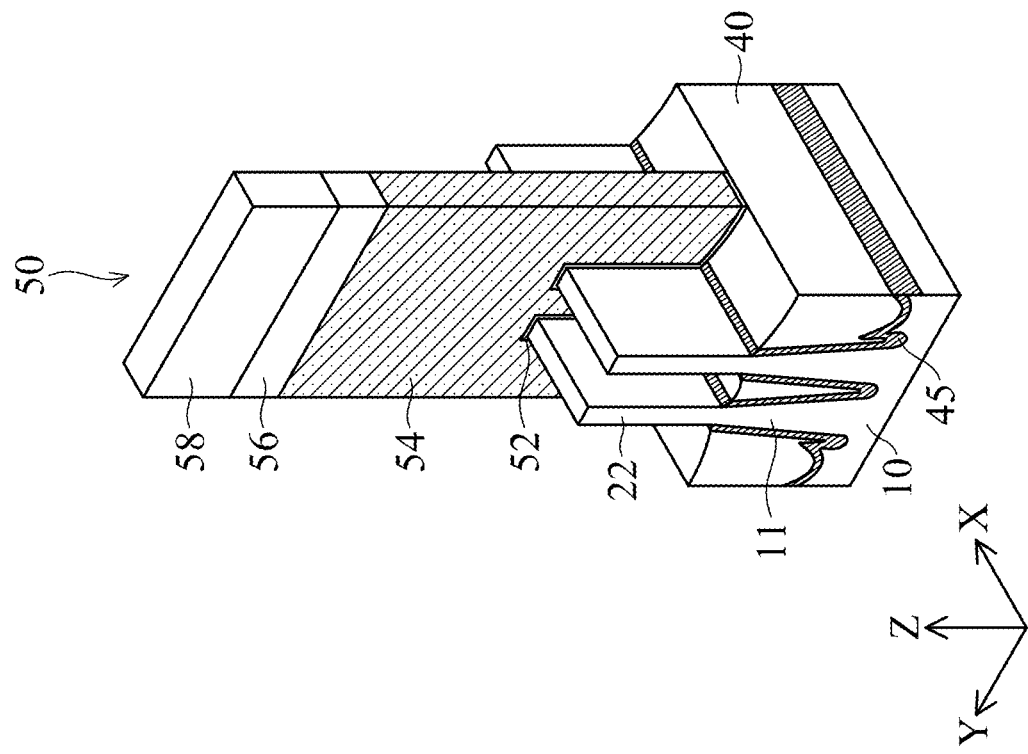
FIG. 7 shows one of the stages of a sequential process for manufacturing a semiconductor device according to an embodiment of the present disclosure.

FIG. 7 illustrates a structure after a sacrificial gate structure 50 is formed over the exposed fin structures 22. The sacrificial gate structure 50 includes a sacrificial gate electrode 54 and the sacrificial gate dielectric layer 52. The sacrificial gate structure 50 is formed over a portion of the fin structure 22 which is to be a channel region. The sacrificial gate structure 50 is formed by first blanket depositing the sacrificial gate dielectric layer over the fin structures. A sacrificial gate electrode layer is then blanket deposited on the sacrificial gate dielectric layer and over the fin structures, such that the fin structures are fully embedded in the sacrificial gate electrode layer. The sacrificial gate electrode layer includes silicon such as polycrystalline silicon or amorphous silicon. In some embodiments, the sacrificial gate electrode layer is subjected to a planarization operation. The sacrificial gate dielectric layer and the sacrificial gate electrode layer are deposited using CVD, including LPCVD and PECVD, PVD, ALD, or other suitable process. Subsequently, a mask layer is formed over the sacrificial gate electrode layer. The mask layer includes a pad SiN layer 56 and a silicon oxide mask layer 58 in some embodiments.

Next, a patterning operation is performed on the mask layer and sacrificial gate electrode layer is patterned into the sacrificial gate structure 50, as shown in FIG. 7.

The sacrificial gate structure 50 includes the sacrificial gate dielectric layer 52, the sacrificial gate electrode layer 54 (e.g., poly silicon), the pad SiN layer 56 and the silicon oxide mask layer 58 in some embodiments. By patterning the sacrificial gate structure 50, the upper portions of the fin structures 22 are partially exposed on opposite sides of the sacrificial gate structure 50, thereby defining source/drain (S/D) regions, as shown in FIG. 7. In this disclosure, a source and a drain are interchangeably used and the structures thereof are substantially the same. In FIG. 7, one sacrificial gate structure is formed, but the number of the sacrificial gate structures is not limited to one. Two or more sacrificial gate structures are arranged in the X direction in some embodiments. In certain embodiments, one or more dummy sacrificial gate structures are formed on both sides of the sacrificial gate structures to improve pattern fidelity.

Figure 8A:
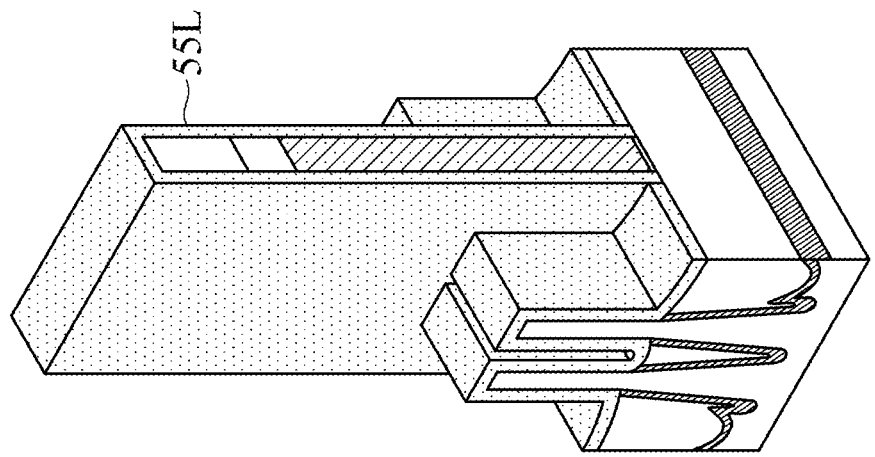
FIGS. 8A and 8B show one of the stages of a sequential process for manufacturing a semiconductor device according to an embodiment of the present disclosure.
Figure 8B:
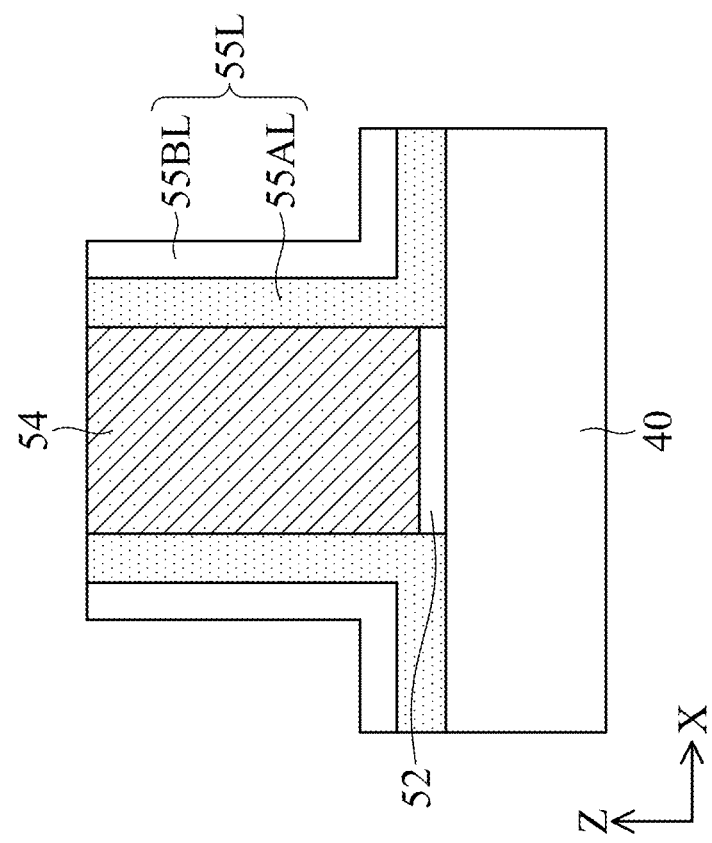

After the sacrificial gate structure 50 is formed, a blanket layer 55L of an insulating material for gate sidewall spacers is conformally formed by using CVD or other suitable methods, as shown in FIG. 8A. The blanket layer 55L is deposited in a conformal manner so that it is formed to have substantially equal thicknesses on vertical surfaces, such as the sidewalls, horizontal surfaces, and the top of the sacrificial gate structure. In some embodiments, the blanket layer 55L is deposited to a thickness in a range from about 2 nm to about 10 nm. In one embodiment, the blanket layer 55L includes one or more layers of insulating materials, such as silicon oxide, silicon nitride, silicon carbide, SiON, SiOCN or SiCN, or any other suitable insulating material. In some embodiments, the blanket layer 55L includes a first layer 55AL and a second layer 55BL made of a different material than the first layer 55AL, as shown in FIG. 8B.

Figure 9A:
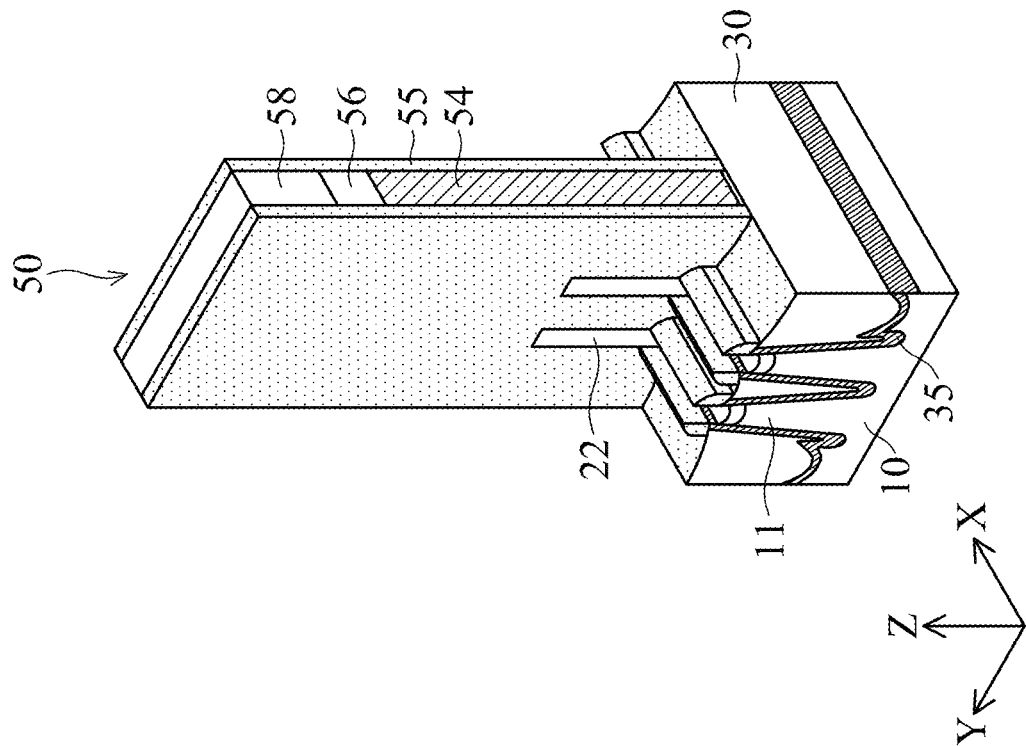
FIGS. 9A and 9B show one of the stages of a sequential process for manufacturing a semiconductor device according to an embodiment of the present disclosure.
Figure 9B:
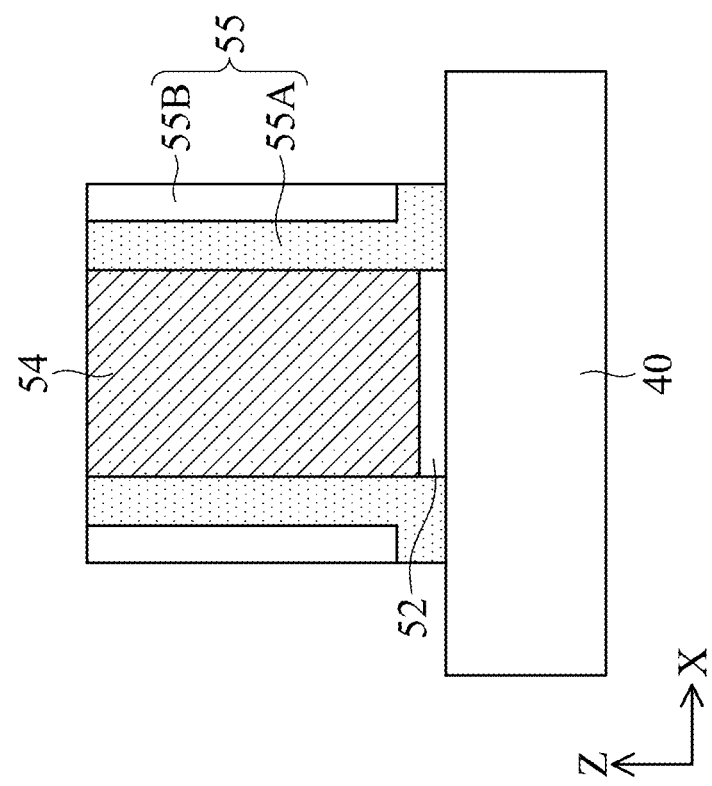

Further, as shown in FIG. 9A, sidewall spacers 55 are formed on opposite sidewalls of the sacrificial gate structure 50, and subsequently, the fin structure 22 of the S/D region is recessed down below the upper surface of the isolation insulating layer 40. After the blanket layer 55L is formed, anisotropic etching is performed on the blanket layer 55L using, for example, reactive ion etching (RIE). During the anisotropic etching process, most of the insulating material is removed from horizontal surfaces, leaving the dielectric spacer layer on the vertical surfaces such as the sidewalls of the sacrificial gate structures and the sidewalls of the exposed fin structures. The mask layer 58 may be exposed from the sidewall spacers. In some embodiments, isotropic etching may be subsequently performed to remove the insulating material from the upper portions of the S/D region of the exposed fin structures 22. In some embodiments, the gate sidewall spacers 55 include a first layer 55A and a second layer 55B, as shown in FIG. 9B.

Subsequently, the fin structures 22 of the S/D regions are recessed down below the upper surface of the isolation insulating layer 40, by using dry etching and/or wet etching. As shown in FIG. 9A, the sidewall spacers 55 formed on the S/D regions of the exposed fin structures (fin sidewalls) partially remain. In other embodiments, however, the sidewall spacers 55 formed on the S/D regions of the exposed fin structures 22 are fully removed.

Figure 10:
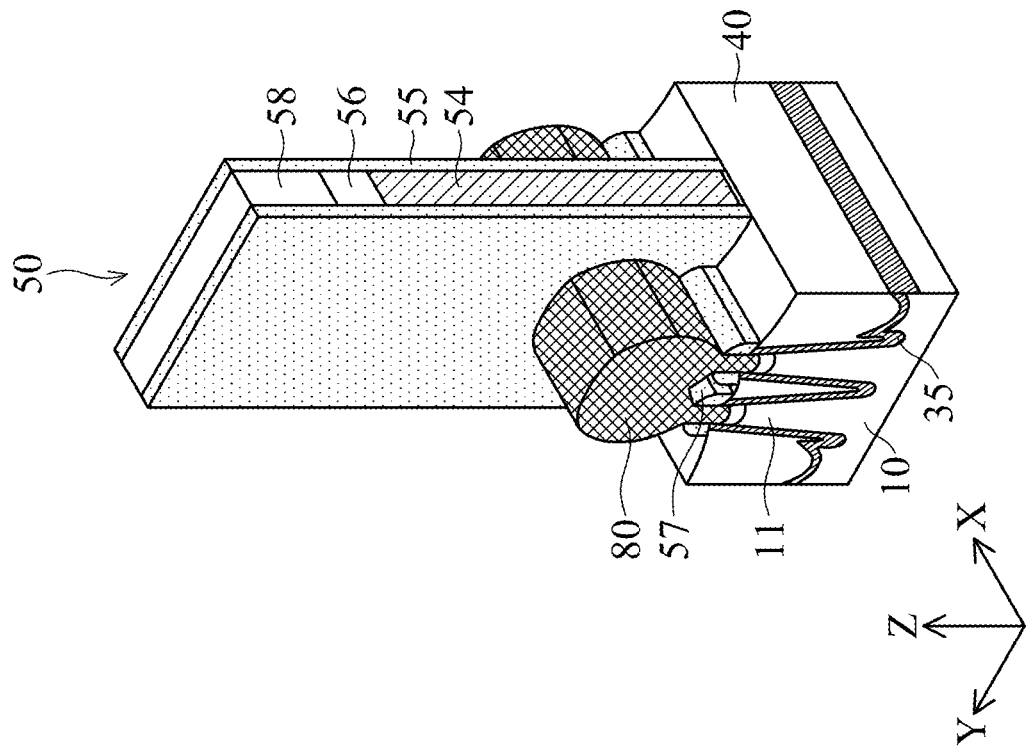
FIG. 10 shows one of the stages of a sequential process for manufacturing a semiconductor device according to an embodiment of the present disclosure.

Subsequently, as shown in FIG. 10, source/drain (S/D) epitaxial layers 80 are formed. The S/D epitaxial layer 80 includes one or more layers of Si, SiP, SiC and SiCP for an n-channel FET or Si, SiGe, Ge, GeSn and SiGeSn, which may be doped with B, for a p-channel FET. The S/D layers 80 are formed by an epitaxial growth method using CVD, ALD or molecular beam epitaxy (MBE).

As shown in FIG. 10, the S/D epitaxial layers 80 grow from the recessed fin structures respectively. The grown epitaxial layers merge above the isolation insulating layer 40 and form a void 57 in some embodiments.

Figure 11:
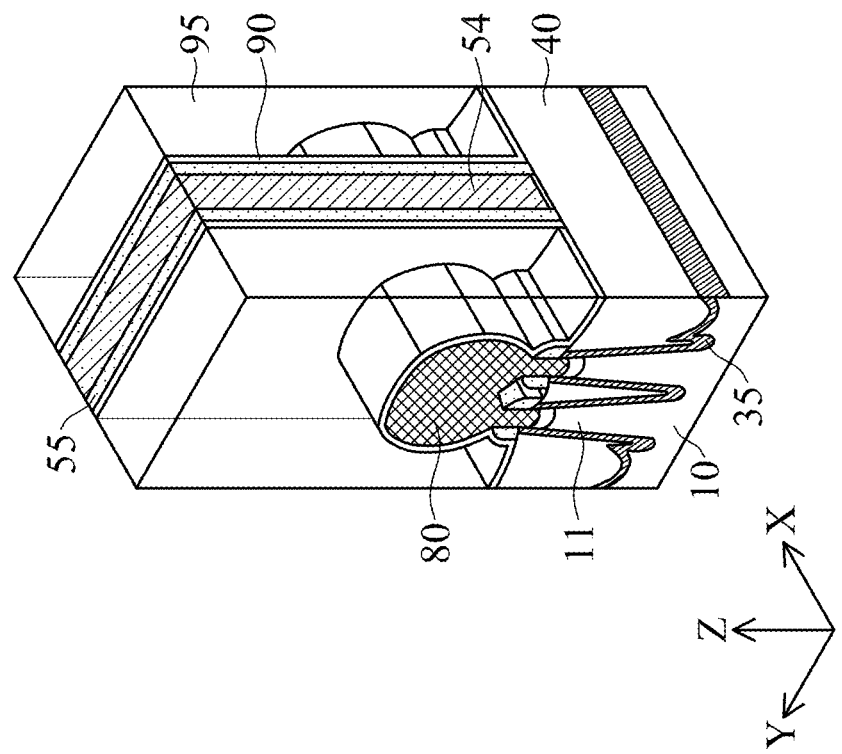
FIG. 11 shows one of the stages of a sequential process for manufacturing a semiconductor device according to an embodiment of the present disclosure.

Subsequently, an insulating liner layer 90, as an etch stop layer, is formed and then an interlayer dielectric (ILD) layer 95 is formed, as shown in FIG. 11. The insulating liner layer 90 is made of a silicon nitride-based material, such as SiN, and functions as a contact etch stop layer in the subsequent etching operations. The materials for the ILD layer 95 include compounds comprising Si, O, C and/or H, such as silicon oxide, SiCOH and SiOC. Organic materials, such as polymers, may be used for the ILD layer 95. After the ILD layer 95 is formed, a planarization operation, such as CMP, is performed, so that the top portion of the sacrificial gate electrode layer 54 is exposed, as shown in FIG. 11.

Figure 12:
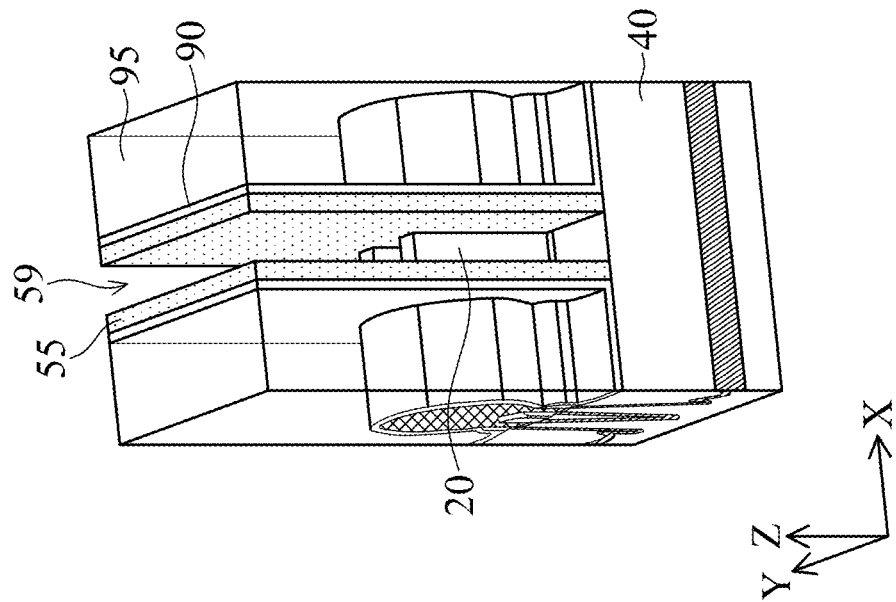
FIG. 12 shows one of the stages of a sequential process for manufacturing a semiconductor device according to an embodiment of the present disclosure.

Next, as shown in FIG. 12, the sacrificial gate electrode layer 54 and sacrificial gate dielectric layer 52 are removed, thereby exposing the fin structures in a gate space 59. The ILD layer 95 protects the S/D structures 80 during the removal of the sacrificial gate structures. The sacrificial gate structures can be removed using plasma dry etching and/or wet etching. When the sacrificial gate electrode layer 54 is polysilicon and the ILD layer 95 is silicon oxide, a wet etchant such as a TMAH solution can be used to selectively remove the sacrificial gate electrode layer 54. The sacrificial gate dielectric layer 52 is thereafter removed using plasma dry etching and/or wet etching.

Figure 13:
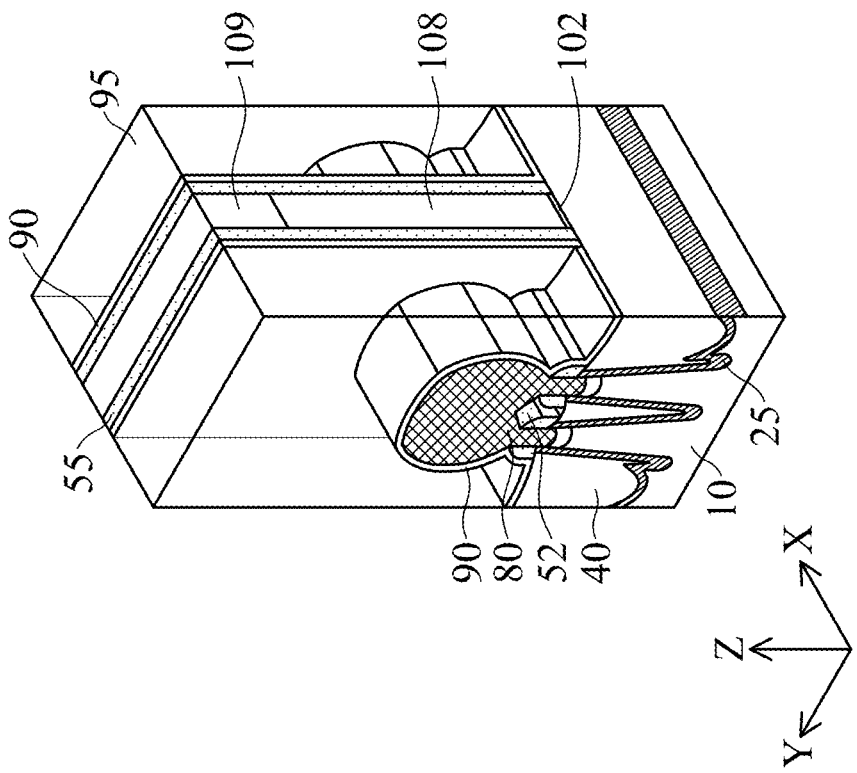
FIG. 13 shows one of the stages of a sequential process for manufacturing a semiconductor device according to an embodiment of the present disclosure.

After the sacrificial gate structures are removed, a gate dielectric layer 102 is formed around the exposed fin structures 22, and a gate electrode layer 108 is formed on the gate dielectric layer 102, as shown in FIG. 13. The operations for forming the metal gate electrode are explained with respect to FIGS. 17A-17F below.

Figure 14:
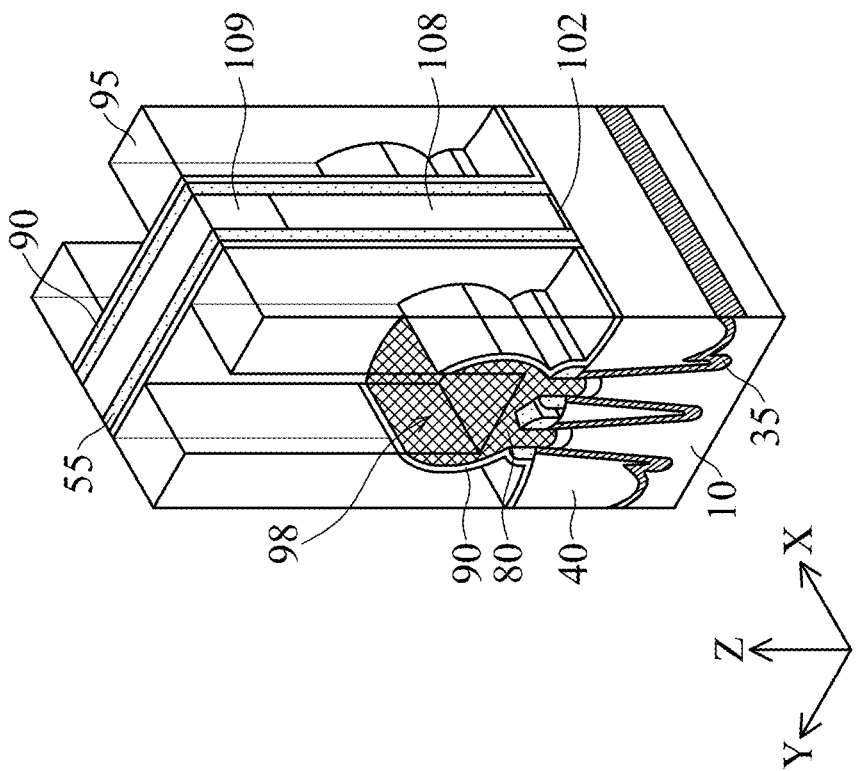
FIG. 14 shows one of the stages of a sequential process for manufacturing a semiconductor device according to an embodiment of the present disclosure.

Subsequently, contact holes 98 are formed in the ILD layer 95 by using dry etching, as shown in FIG. 14. In some embodiments, the upper portion of the S/D epitaxial layer 80 is etched.

Figure 15:
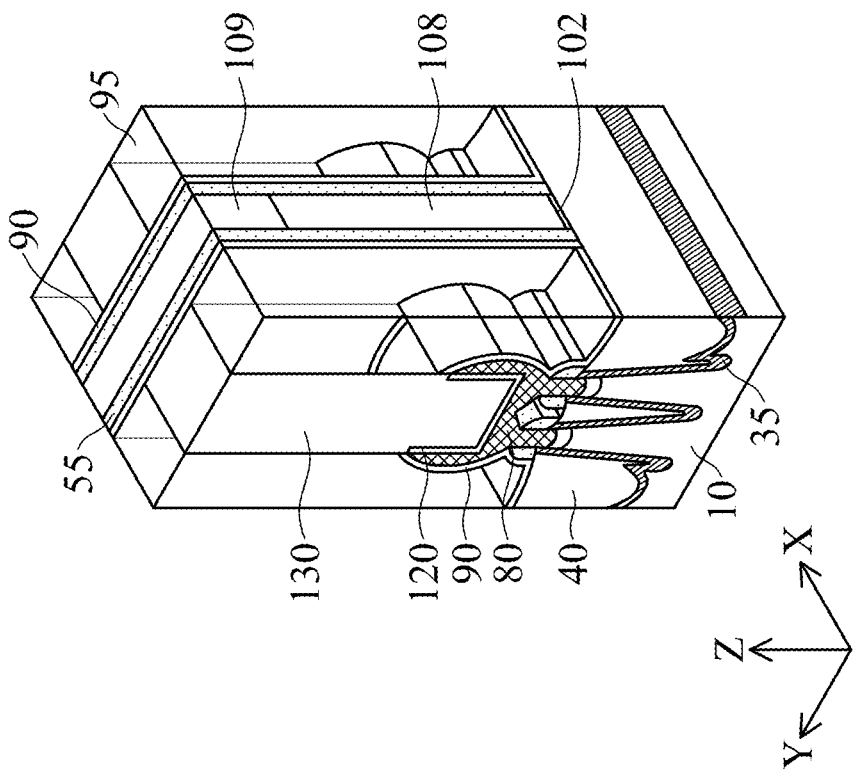
FIG. 15 shows one of the stages of a sequential process for manufacturing a semiconductor device according to an embodiment of the present disclosure.
Figure 16:
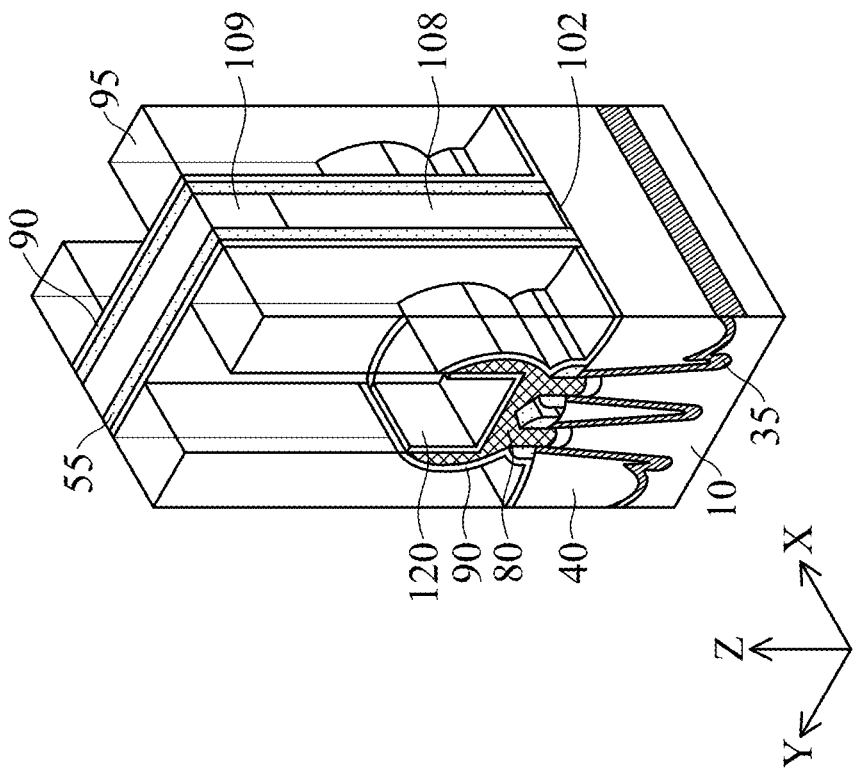
FIG. 16 shows one of the stages of a sequential process for manufacturing a semiconductor device according to an embodiment of the present disclosure.

One or more silicide layers 120 are formed over the S/D epitaxial layer 80, as shown in FIG. 15. Then, a conductive material 130 as a source/drain contact is formed in the contact holes as shown in FIG. 16. The conductive material 130 includes one or more of Co, Ni. W, Ti, Ta, Cu, Al, TiN and TaN. The operations for forming the silicide layers and the source/drain contact are explained with respect to FIGS. 18A-18H below.

FIGS. 17A-17F show various views of a sequential process for a gate replacement operation according to an embodiment of the present disclosure. It is understood that additional operations can be provided before, during, and after processes shown by FIGS. 17A-17F, and some of the operations described below can be replaced or eliminated, for additional embodiments of the method. The order of the operations/processes may be interchangeable.

Figure 17B:
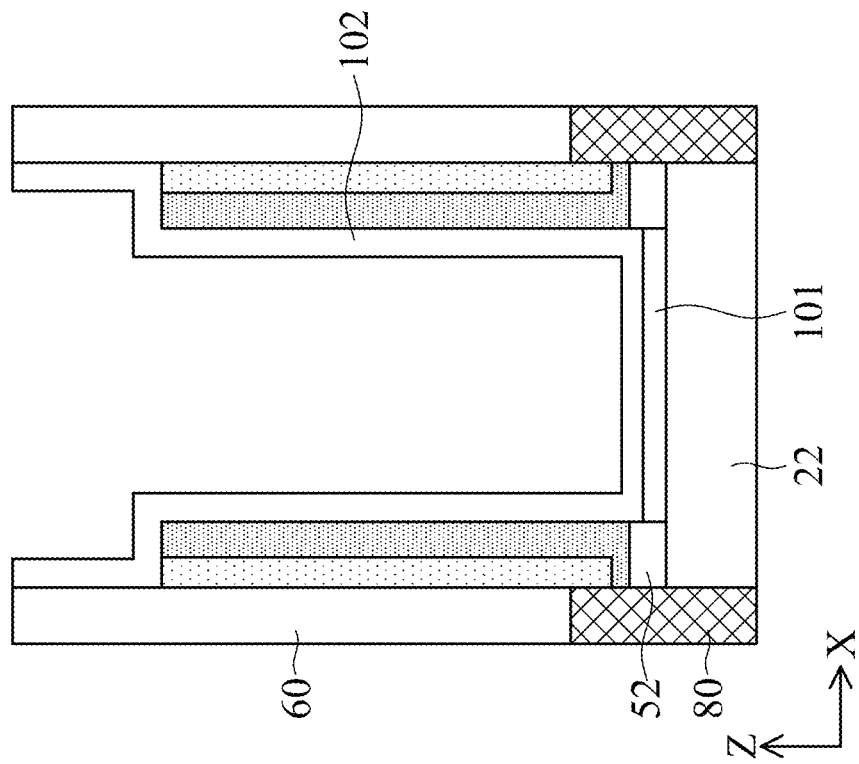
Figure 17A:
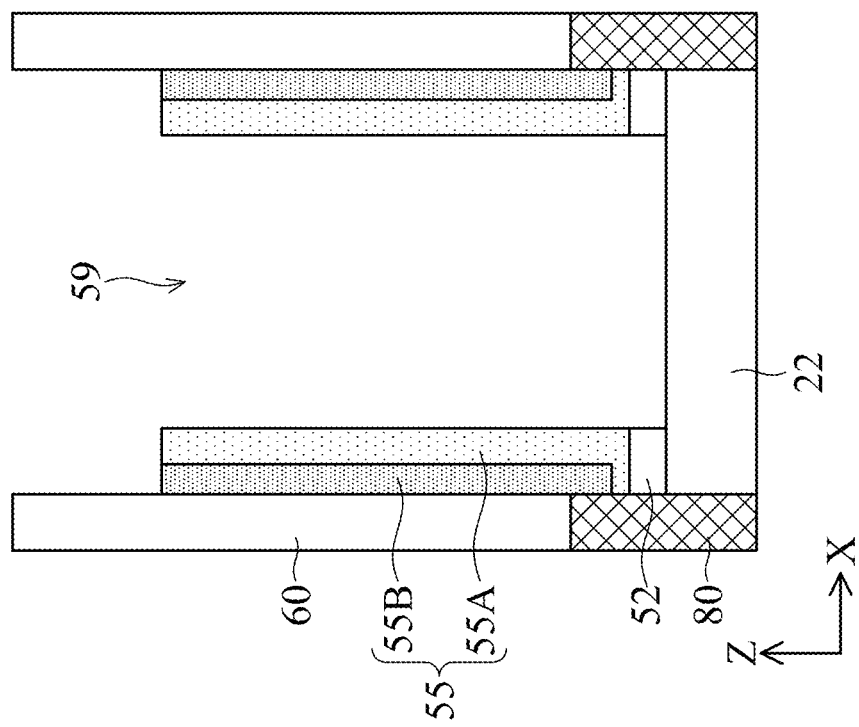

FIG. 17A is an enlarged view of a gate electrode portion after the sacrificial gate electrode and gate dielectric layer are removed. As shown in FIG. 17A, during or after the sacrificial gate electrode and gate dielectric layer are removed, an upper portion of the gate sidewall spacers 55 including the first layer 55A and the second layer 55B is also removed. Then, as shown in FIG. 17B, an interfacial layer 101 is formed on the channel region of the fin structure 22. In some embodiments, the interfacial layer 101 is a chemically oxidized silicon oxide. Then, the gate dielectric layer 102 is formed as shown in FIG. 17B.

In some embodiments, the gate dielectric layer 102 includes one or more layers of a dielectric material, such as silicon oxide, silicon nitride, or high-k dielectric material, other suitable dielectric material, and/or combinations thereof. Examples of high-k dielectric material include $HfO_2$, HfSiO, HfSiON, HfTaO, HfTiO, HfZrO, zirconium oxide, aluminum oxide, titanium oxide, hafnium dioxide-alumina ($HfO_2$—$Al_2O_3$) alloy, other suitable high-k dielectric materials, and/or combinations thereof. The gate dielectric layer 102 may be formed by CVD, ALD or any suitable method. In one embodiment, the gate dielectric layer 102 is formed using a highly conformal deposition process such as ALD in order to ensure the formation of a gate dielectric layer having a uniform thickness on the channel regions. The thickness of the gate dielectric layer 102 is in a range from about 1 nm to about 6 nm in some embodiments.

Next, as shown in FIG. 17C, one or more conductive layers including work function adjustment layer 103 are formed over the gate dielectric layer 102. The work function adjustment layer is made of a conductive material such as a single layer of TiN, TaN, TaAlC, TiC, TaC, Co, Al, TiAl, HfTi, TiSi, TaSi or TiAlC, or a multilayer of two or more of these materials. For the n-channel FET, one or more of TaN, TaAlC, TiN, TiC, Co, TiAl, HfTi, TiSi and TaSi is used as the work function adjustment layer, and for the p-channel FET, one or more of WN, WCN, W, Ru, Co, TiN or TiSiN is used as the work function adjustment layer. The work function adjustment layer may be formed by ALD, PVD, CVD, e-beam evaporation, or other suitable process. Further, the work function adjustment layer may be formed separately for the n-channel FET and the p-channel FET which may use different metal layers.

Then, as shown in FIG. 17D, the work function adjustment layer 103 and the gate dielectric layer 102 are recessed down below the top of the gate sidewall spacers 55. Subsequently, a body gate electrode layer 106 is formed over the recessed work function adjustment layer 103 and gate dielectric layer 102, as shown in FIG. 17E.

The body gate electrode layer 106 includes one or more layers of conductive material, such as polysilicon, aluminum, copper, titanium, tantalum, tungsten, cobalt, molybdenum, tantalum nitride, nickel silicide, cobalt silicide, TiN, WN, TiAl, TiAlN, TaCN, TaC, TaSiN, metal alloys, other suitable materials, and/or combinations thereof. The work function adjustment layer 103 and the body gate electrode layer 106 may be formed by CVD, PVD, ALD, electroplating, or other suitable method.

Figure 17F:
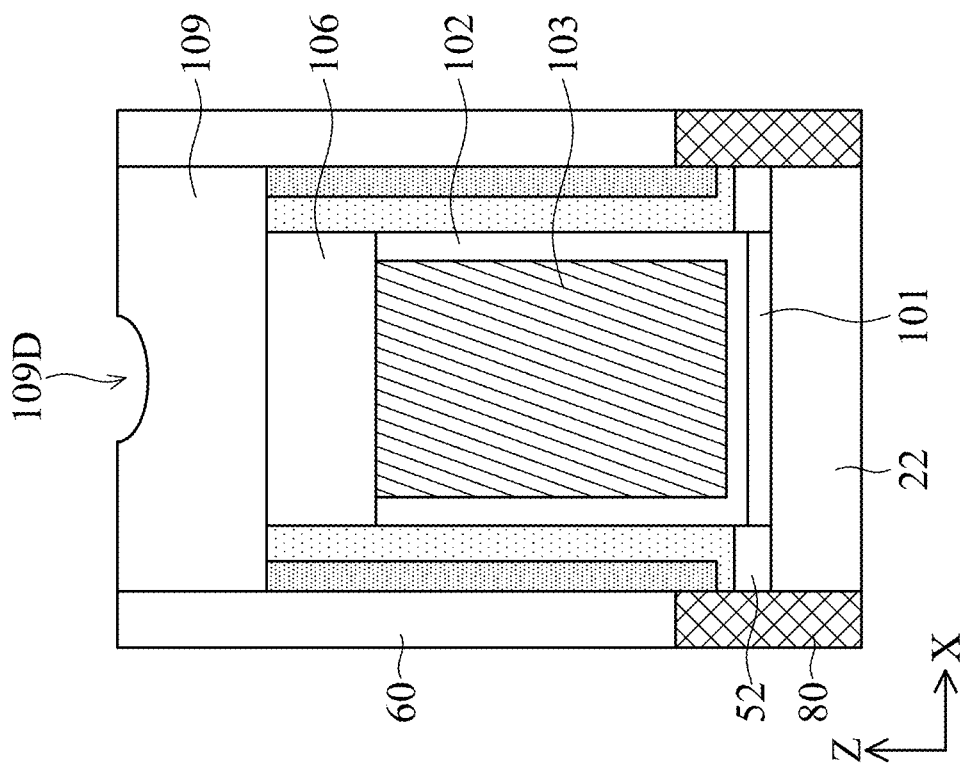
Figure 17E:
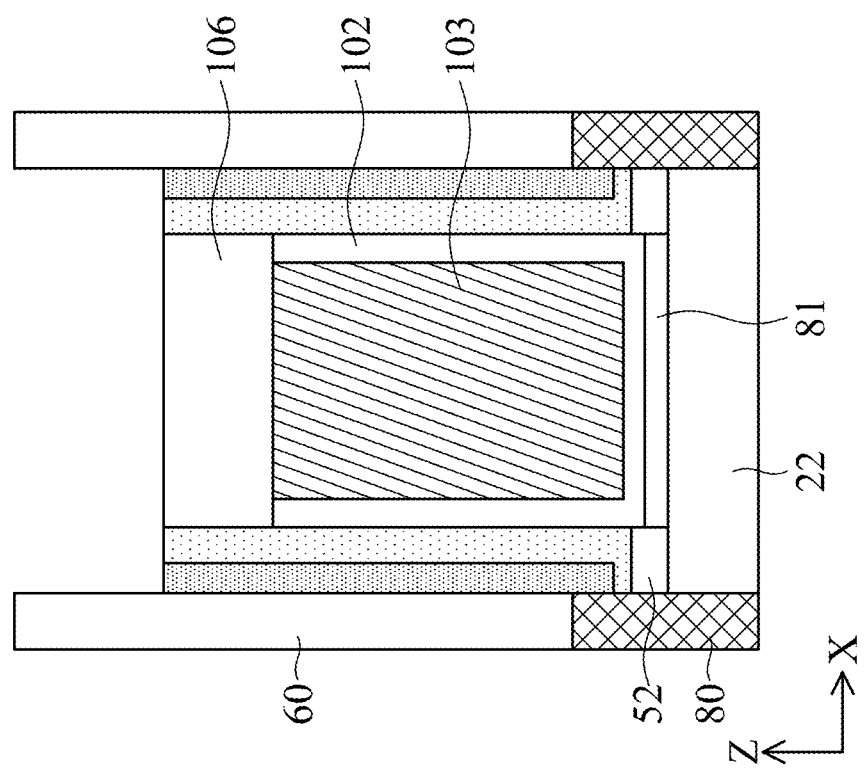

Subsequently, a cap insulating layer 109 is formed over the body gate electrode layer 106, as shown in FIG. 17F. In some embodiments, the cap insulating layer 109 includes one or more layers of a silicon nitride-based material, such as SiN. The cap insulating layer 109 can be formed by depositing an insulating material followed by a planarization operation. In some embodiments, as shown in FIG. 17F, a recess, dimple or trench 109D is formed on the upper surface of the cap insulating layer 109.

FIGS. 18A-18H show various views of a sequential process for forming a silicide and contact structure according to an embodiment of the present disclosure. It is understood that additional operations can be provided before, during, and after processes shown by FIGS. 18A-18H, and some of the operations described below can be replaced or eliminated, for additional embodiments of the method. The order of the operations/processes may be interchangeable.

Figures 18E, 18F:
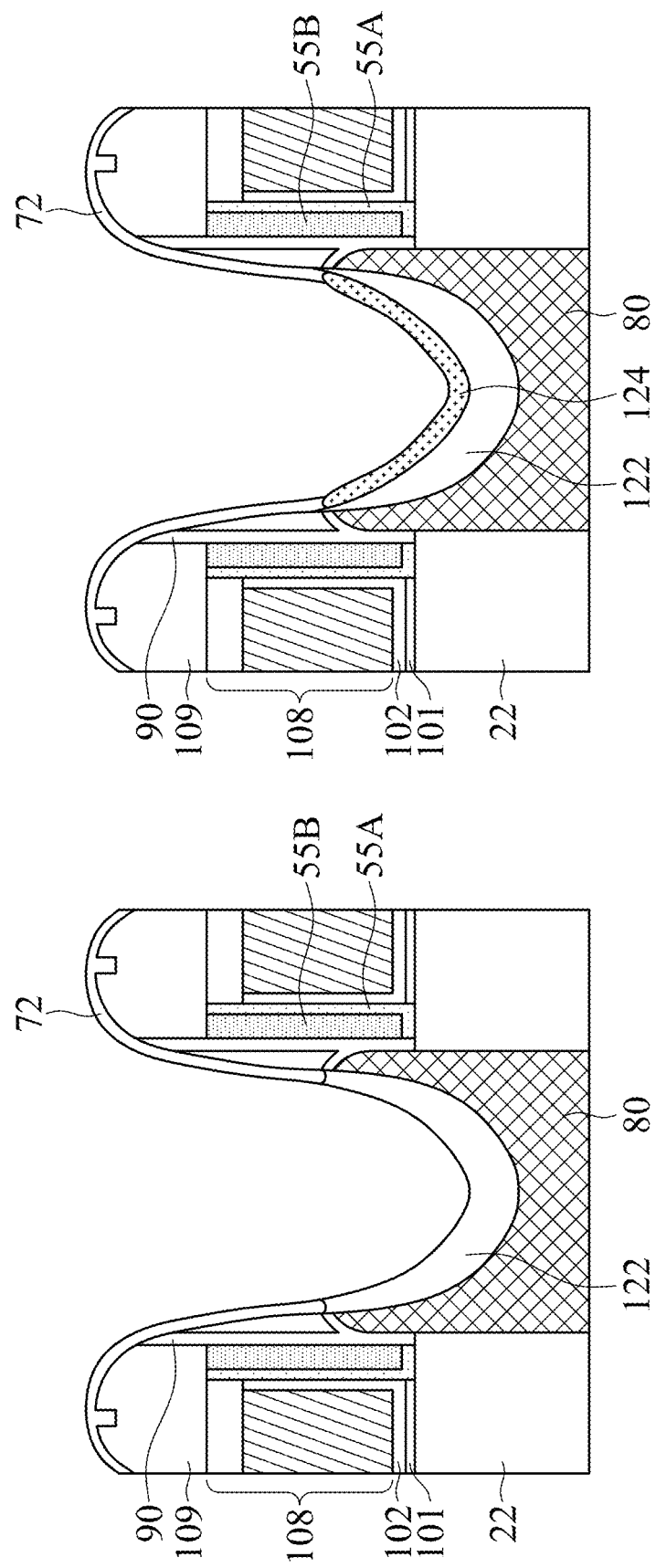

FIG. 18A is an enlarged view of a source/drain region corresponding to FIG. 13. In FIGS. 18A-18H, a source/drain region disposed between two adjacent gate structures is shown. As shown in FIG. 18B, a contact hole 98 is formed as explained with FIG. 14. As shown in FIG. 18B, an upper part of the source/drain epitaxial layer 80 is etched to have a concave shape (U-shape) in some embodiments. In some embodiments, the cap insulating layer 109 is also etched to form a rounded shape. In some embodiments, the recess 109D remains. In some embodiments, a part of the first ILD layer 95 also remains. In some embodiments, the depth DD of the recess 109D is in a range from about 2 nm to about 20 nm.

Then, as shown in FIG. 18C, a dielectric cover layer 72 is formed over the etched source/drain epitaxial layer 80 and the cap insulating layer 109. In some embodiments, the dielectric cover layer 72 is a silicon nitride layer formed by ALD. As shown in FIG. 18C, the cover layer 72 fully fills the recess 109D on the cap insulating layer 109. In some embodiments, the thickness of the cover layer 72 is in a range from about 1 nm to about 10 nm, and is in a range from about 2 nm to about 5 nm in other embodiments. When the thickness is smaller than these ranges, the recess 109D may not be sufficiently filled, and if the thickness is greater than these ranges, the size of the source/drain contact may become small, which increases contact resistance.

Next, as shown in FIG. 18D, the cover layer 72 is partially removed by etching. Since the structure or film property of the cover layer 72 on a semiconductor region (source/drain epitaxial layer 80) are different from those of the cover layer on a dielectric region, a part of the cover layer 72 formed on the source/drain epitaxial layer 80 can be selectively removed. In some embodiments, the cover layer 72 (e.g., SiN layer) is deposited by using an ALD process on both the top of the cap insulating layer 109 and on the source/drain epitaxial layer 80 (e.g., SiGe or SiAs). After the ALD deposition, an atomic layer etching (ALE) process is carried out for selectively etch the cover layer near the epitaxial layer by precisely tuning one or more conditions of the ALE process (e.g., gas pulse amount, gas pulse timing, gas pulse duty ratio, RF pulse cycles and/or RF pulse duty ratio, etc). Since the concentration of oxides inside the cover layer 72 is smaller than that in the epitaxial layer, the ALE process is prone to react near the source/drain epitaxial layer 80. Since the ALE process is tuned for vertical bombardment mode (strike mode) in a top-to-bottom manner, the side-wall of the cover layer 72 remains as shown in FIG. 18D.

Then, as shown in FIG. 18E, a first silicide layer 122 is formed on the source/drain epitaxial layer 80. In some embodiments, the first silicide layer 122 includes a Ni silicide (NiSi$_x$). In some embodiments, a Ni metal layer is formed by sputtering and then an annealing operation is performed to form the Ni silicide layer 122. When there is an un-reacted Ni layer, the un-reacted Ni layer is removed by etching. In some embodiments, the annealing temperature is in a range from about 500° C. to about 700° C.

In some embodiments, the thickness of the Ni silicide layer 122 at the center between two gate structures is in a range from about 5 nm to about 15 nm. In some embodiments, the Ni silicide layer 122 includes platinum (Pt). In some embodiments, a Pt concentration is in a range of about 1 atomic % to about 10 atomic % of the concentration of Ni (Ni %). In some embodiments, a Ni concentration in the Ni silicide layer is in a range from about 20 atomic % to about 60 atomic %, and is in a range from about 35 atomic % to about 45 atomic % in other embodiments. When the amount of Ni is smaller than these ranges, Si in the source/drain epitaxial layer 80 is overconsumed, which may result in epitaxial contamination, and when the amount of Ni is greater than these ranges, it indicates silicon consumption is too low, which may mean that the Ni silicide layer is not properly formed.

Then, as shown in FIG. 18F, a second silicide layer 124 is formed over the first silicide layer 122. In some embodiments, the second silicide layer 124 includes titanium-nickel silicide (TiNiSi$_x$). In some embodiments, in an n-type FET, the first silicide layer is made of a material having a higher Schottky barrier height to the source/drain epitaxial layer than a Ti silicide, and in a p-type FET, the first silicide layer is made of a material having a lower Schottky barrier height to the source/drain epitaxial layer than a Ti silicide.

In some embodiments, a Ti metal layer is formed by sputtering or CVD on the first silicide layer 122. In some embodiments, a CVD process using TiCl$_x$ gas is employed to form the Ti layer. Then, an annealing operation is performed to form the Ti—Ni silicide layer 124. When there is an un-reacted Ti layer, the un-reacted Ti layer is removed by etching. In some embodiments, the annealing temperature for the Ti—Ni silicide layer 124 is lower than the annealing temperature for the Ni silicide layer 122, and is in a range from about 350° C. to about 500° C.

In some embodiments, the thickness of the Ti—Ni silicide layer 124 at the center between two gate structures is smaller than the thickness of the Ni silicide layer 122, and is in a range from about 2 nm to about 5 nm. In some embodiments, a Ni concentration is greater than a Ti concentration in the Ti—Ni silicide layer 124. In some embodiments, a ratio (Ni/Ti) between the Ni concentration and the Ti concentration is in a range from about 1.01 to about 5, and is in a range from about 1.5 to about 3 in other embodiments. As shown in FIG. 18F, each of the first silicide layer 122 and the second silicide layer 124 has a concave shape (U-shape).

Next, as shown in FIG. 18G, a barrier or an adhesion layer 126 is formed over the second silicide layer 124 and over the dielectric regions. In some embodiments, the layer 126 includes TiN formed by CVD or sputtering. When a CVD process is used, the source gases include TiCl$_x$ as a titanium source and NF or NH$_3$ as a nitrogen source, in some embodiments. In some embodiments, the thickness of the TiN layer 126 is in a range from about 0.5 nm to about 8 nm and is in a range from about 1 nm to about 5 nm in other embodiments. In some embodiments, the Ti concentration in the TiN barrier layer is about 5% to about 15% less than the Ti concentration in the second silicide layer 124.

Subsequently, a seed layer 128 is formed over the TiN layer 126 as shown in FIG. 18G, and a source/drain contact layer 130 is formed on the seed layer as shown in FIG. 18H. In some embodiments, the seed layer 128 and the source/drain contact layer 130 are made of cobalt (Co) metal. In some embodiments, the Co seed layer 128 is formed by CVD or PVD. In some embodiments, the thickness of the seed layer 128 is in a range from about 0.2 nm to abut 2 nm. Then, the Co source/drain contact layer 130 is formed on the seed layer by electroplating or CVD in some embodiments. In other embodiments, the source/drain contact layer 130 is made of tungsten (W), ruthenium (Ru) or other suitable material. In such cases, an appropriate seed layer is selected.

It is understood that the FinFETs undergo further CMOS processes to form various features such as contacts/vias, interconnect metal layers, dielectric layers, passivation layers, etc.

FIGS. 19-33H show a sequential process for manufacturing a GAA FET device according to an embodiment of the present disclosure. It is understood that additional operations can be provided before, during, and after processes shown by FIGS. 19-33H, and some of the operations described below can be replaced or eliminated, for additional embodiments of the method. The order of the operations/processes may be interchangeable. Materials, configurations, dimensions, and/or processes as described with respect to FIGS. 1-18H (Fin FET) are applicable to the following embodiments, and the detailed explanation thereof may be omitted.

Similar to FIG. 1, impurity ions (dopants) 12 are implanted into a silicon substrate 10 to form a well region. Then, as shown in FIG. 19, stacked semiconductor layers are formed over the substrate 10. The stacked semiconductor layers include first semiconductor layers 220 and second semiconductor layers 225. Further, a mask layer 215 similar to the mask layer 15 is formed over the stacked layers.

The first semiconductor layers 220 and the second semiconductor layers 225 are made of materials having different lattice constants, and may include one or more layers of Si, Ge, SiGe, GaAs, InSb, GaP, GaSb, InAlAs, InGaAs, GaSbP, GaAsSb or InP. In some embodiments, the first semiconductor layers 220 and the second semiconductor layers 225 are made of Si, a Si compound, SiGe, Ge or a Ge compound. In one embodiment, the first semiconductor layers 220 are $Si_{1-x}Ge_x$, where x is more than about 0.3, or Ge (x=1.0) and the second semiconductor layers 225 are Si or $Si_{1-y}Ge_y$, where y is less than about 0.4, and x>y. In this disclosure, an "M compound" or an "M based compound" means the majority of the compound is M.

In another embodiment, the second semiconductor layers 225 are $Si_{1-y}Ge_y$, where y is more than about 0.3, or Ge, and the first semiconductor layers 220 are Si or $Si_{1-x}Ge_x$, where x is less than about 0.4, and x<y. In yet other embodiments, the first semiconductor layer 220 is made of $Si_{1-x}Ge_x$, where x is in a range from about 0.3 to about 0.8, and the second semiconductor layer 225 is made of $Si_{1-x}Ge_x$, where x is in a range from about 0.1 to about 0.4.

In FIG. 19, five layers of the first semiconductor layers 220 and six layers of the second semiconductor layers 225 are disposed. However, the number of the layers are not limited to five, and may be as small as 1 (each layer) and in some embodiments, 2-10 layers of each of the first and second semiconductor layers are formed. By adjusting the numbers of the stacked layers, a driving current of the GAA FET device can be adjusted.

The first semiconductor layers 220 and the second semiconductor layers 225 are epitaxially formed over the substrate 10. The thickness of the first semiconductor layers 220 may be equal to or greater than that of the second semiconductor layers 225, and is in a range from about 5 nm to about 50 nm in some embodiments, and is in a range from about 10 nm to about 30 nm in other embodiments. The thickness of the second semiconductor layers 225 is in a range from about 5 nm to about 30 nm in some embodiments, and is in a range from about 10 nm to about 20 nm in other embodiments. The thickness of each of the first semiconductor layers 220 may be the same, or may vary.

In some embodiments, the bottom first semiconductor layer (the closest layer to the substrate 10) is thicker than the remaining first semiconductor layers. The thickness of the bottom first semiconductor layer is in a range from about 10 nm to about 50 nm in some embodiments, or is in a range from 20 nm to 40 nm in other embodiments.

In some embodiments, the mask layer 215 includes a first mask layer 215A and a second mask layer 215B, similar to the mask layer 15.

Next, as shown in FIG. 20, the stacked layers of the first and second semiconductor layers 220, 225 are patterned by using the patterned mask layer, thereby the stacked layers are formed into fin structures 230 extending in the X direction. In FIG. 20, two fin structures 230 are arranged in the Y direction. But the number of the fin structures is not limited to, and may be as small as one and three or more. In some embodiments, one or more dummy fin structures are formed on both sides of the fin structures 230 to improve pattern fidelity in the patterning operations. As shown in FIG. 20, the fin structures 230 have upper portions constituted by the stacked semiconductor layers 220, 225 and well portions 211.

The width W1 of the upper portion of the fin structure along the Y direction is in a range from about 10 nm to about 40 nm in some embodiments, and is in a range from about 20 nm to about 30 nm in other embodiments. The height H1 along the Z direction of the fin structure is in a range from about 100 nm to about 200 nm.

Figure 21:
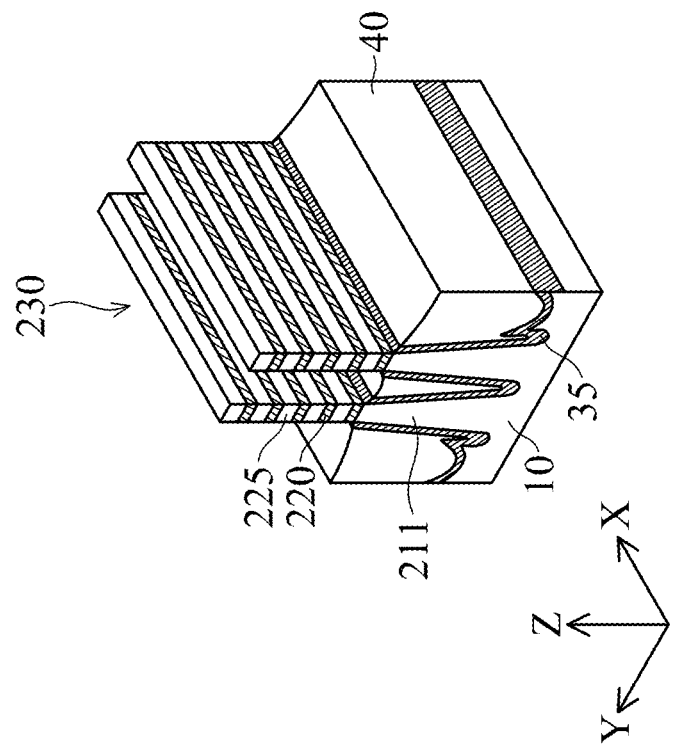
FIG. 21 shows one of the stages of a sequential process for manufacturing a FET device according to an embodiment of the present disclosure.

After the fin structure is formed, an insulating material layer 41 is formed over the substrate so that the fin structures are fully embedded in the insulating material layer 41. Then, a planarization operation, such as a chemical mechanical polishing (CMP) method and/or an etch-back method, is performed such that the upper surface of the uppermost second semiconductor layer 225 is exposed from the insulating material layer 41 as shown in FIG. 21. In some embodiments, one or more liner layers 35 is formed before forming the insulating material layer 41.

Figure 22:
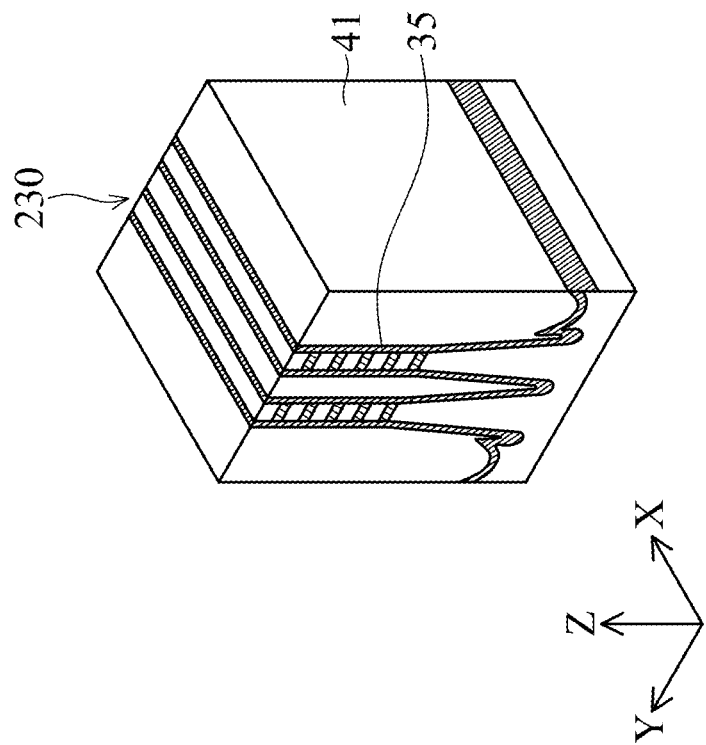
FIG. 22 shows one of the stages of a sequential process for manufacturing a FET device according to an embodiment of the present disclosure.

Then, as shown in FIG. 22, the insulating material layer 41 is recessed to form an isolation insulating layer 40 so that the upper portions of the fin structures 230 are exposed. In the embodiment shown in FIG. 22, the insulating material layer 41 is recessed until the bottommost first semiconductor layer 220 is exposed. In other embodiments, the upper portion of the well layer 211 is also partially exposed. The first semiconductor layers 220 are sacrificial layers which are subsequently partially removed, and the second semiconductor layers 225 are subsequently formed into channel layers of a GAA FET. In some embodiments, the liner layer 35 is recessed along with the insulating material layer.

Figure 24:
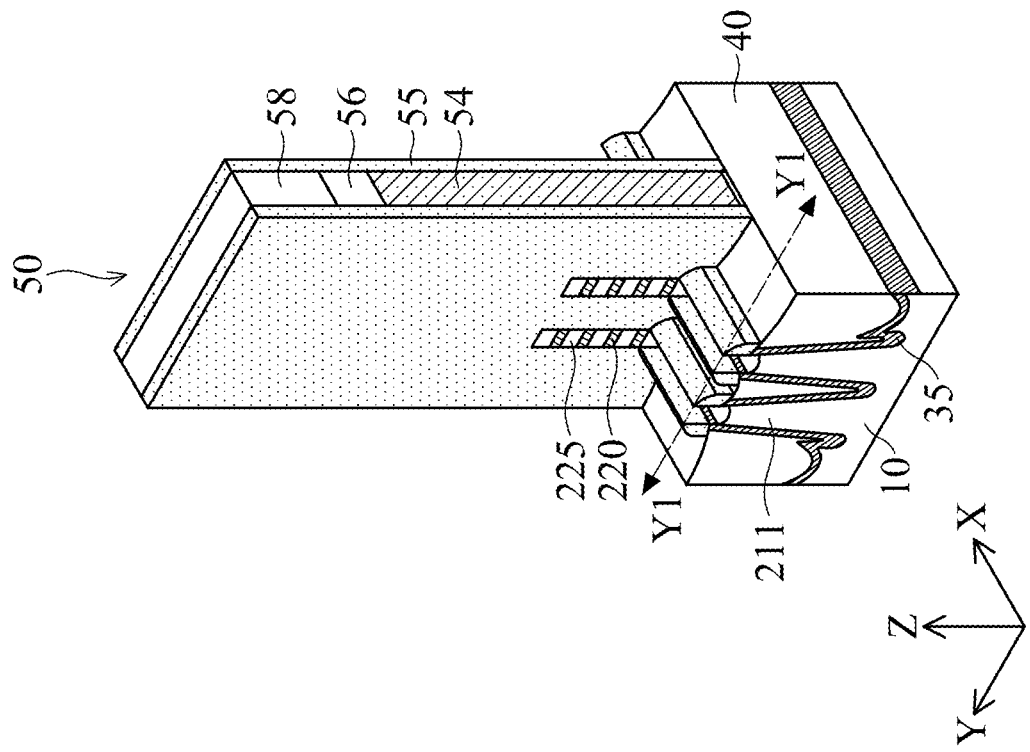
FIG. 24 shows one of the stages of a sequential process for manufacturing a FET device according to an embodiment of the present disclosure.
Figure 23:
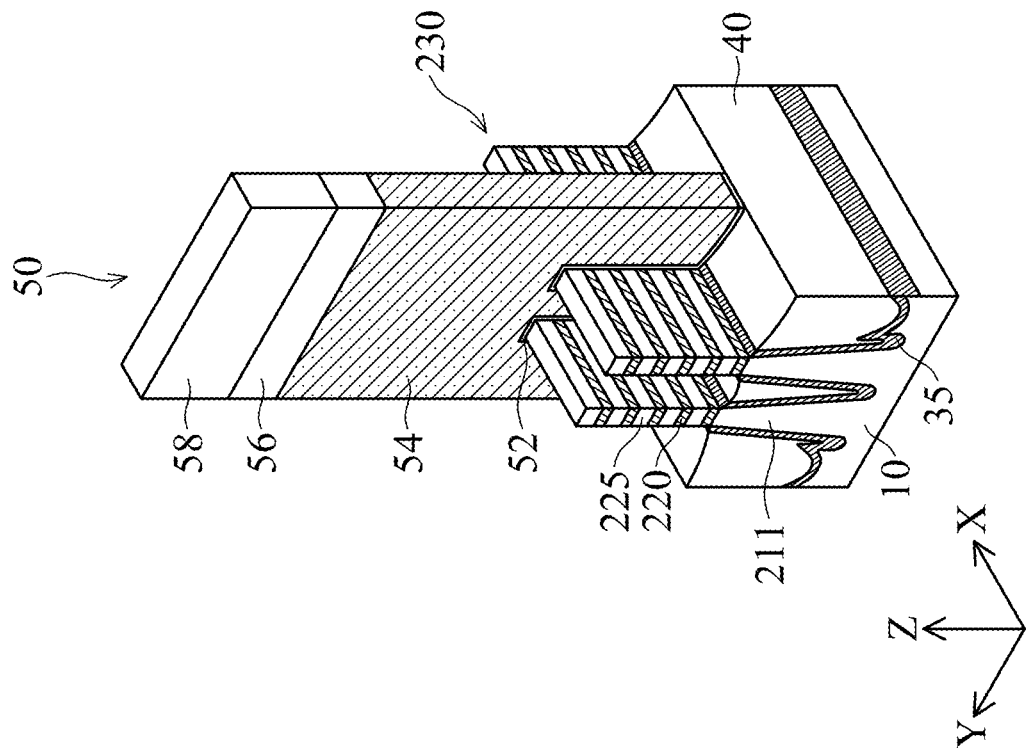
FIG. 23 shows one of the stages of a sequential process for manufacturing a FET device according to an embodiment of the present disclosure.

After the isolation insulating layer 40 is formed, a sacrificial gate structure 50 is formed over the exposed fin structures 230. The sacrificial gate structure 50 is formed over a portion of the fin structure which is to be a channel region. The sacrificial gate structure defines the channel region of the GAA FET. After the sacrificial gate structure is formed, a blanket layer of an insulating material for sidewall spacers 55 is conformally formed by using CVD or other suitable methods, and then sidewall spacers 55 are formed on opposite sidewalls of the sacrificial gate structures, as shown in FIG. 24. Subsequently, the fin structures of the S/D regions are recessed down below the upper surface of the isolation insulating layer 40 by using dry etching and/or wet etching.

Figure 25:
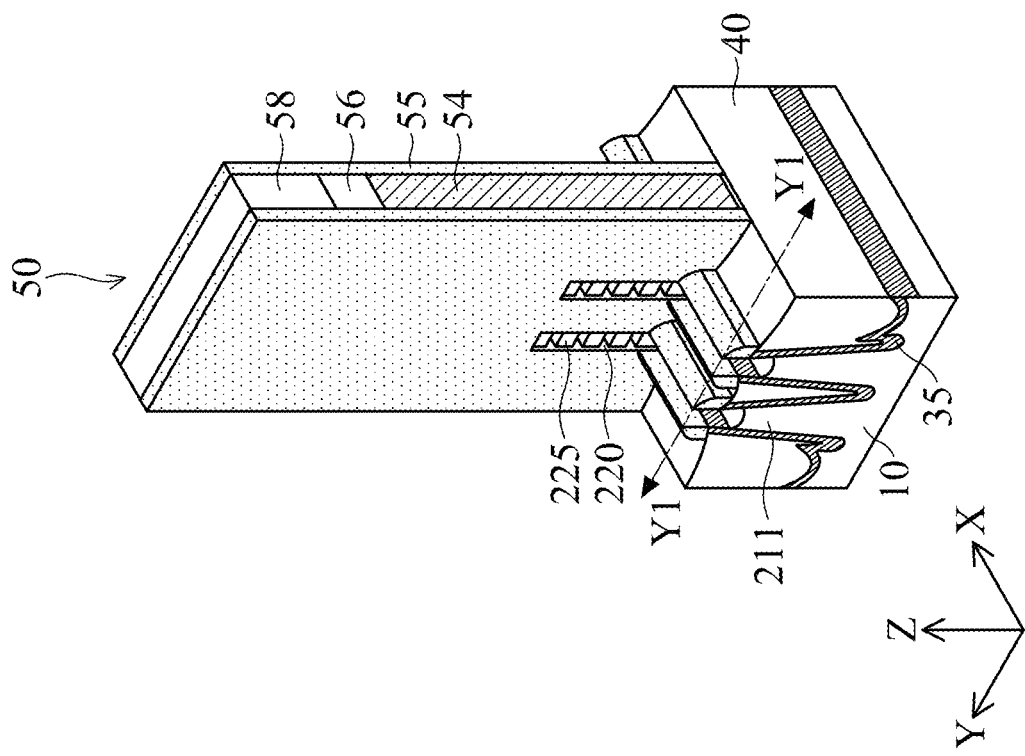
FIG. 25 shows one of the stages of a sequential process for manufacturing a FET device according to an embodiment of the present disclosure.

Subsequently, as shown in FIG. 25, the first semiconductor layers 220 are horizontally recessed (etched) so that edges of the first semiconductor layers 220 are located substantially below a side face of the sacrificial gate electrode layer 54. The lateral depth of the recessing of the first semiconductor layers 220 from the plane including one sidewall spacer 55 is in a range from about 5 nm to about 10 nm.

Figure 26A:
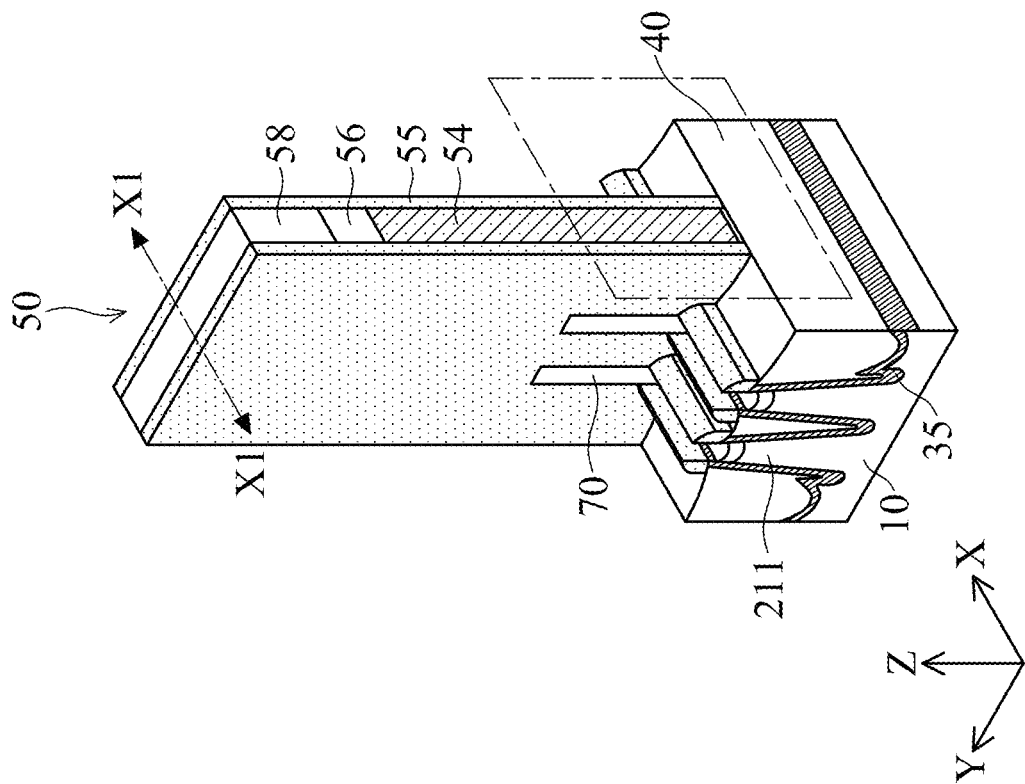
FIGS. 26A and 26B show one of the stages of a sequential process for manufacturing a semiconductor device according to an embodiment of the present disclosure.
Figure 26B:
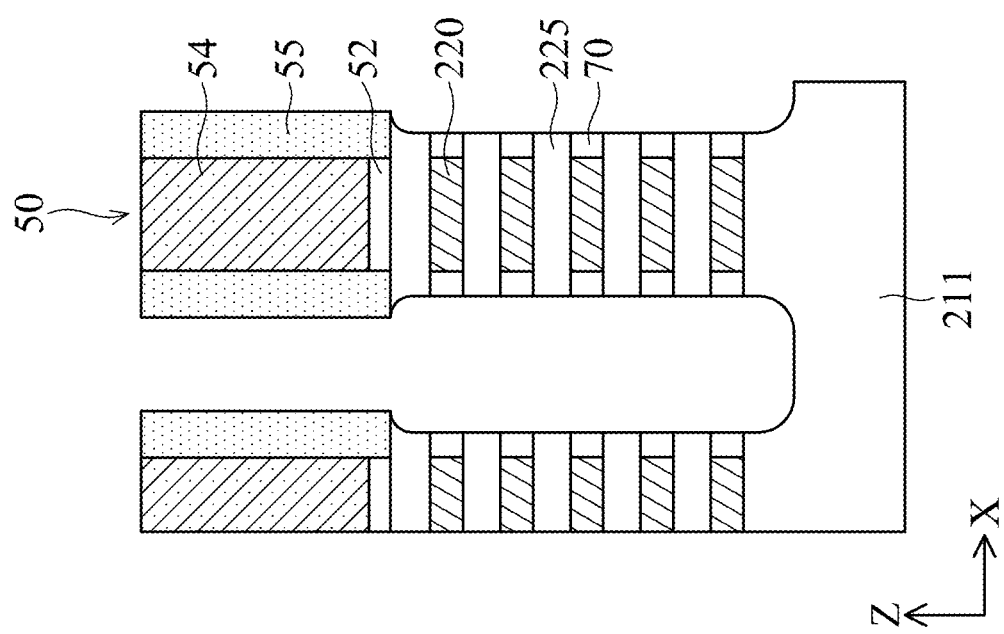

After the first semiconductor layers 220 are horizontally recessed, a liner insulating layer for inner spacers is formed on the recessed surfaces of the first and second semiconductor layers 220, 225, and then anisotropic etching is performed to form inner spacers 70, as shown in FIGS. 26A and 26B. In some embodiments, the inner spacers 70 are made of one or more layers of silicon oxide, silicon nitride, SiON, SiOC, SiOCN or any other suitable insulating material. The thickness of the inner spacers 70 on the recessed surface of the second semiconductor layers 225 is in a range from about 1 nm to about 4 nm, in some embodiments.

Figure 28:
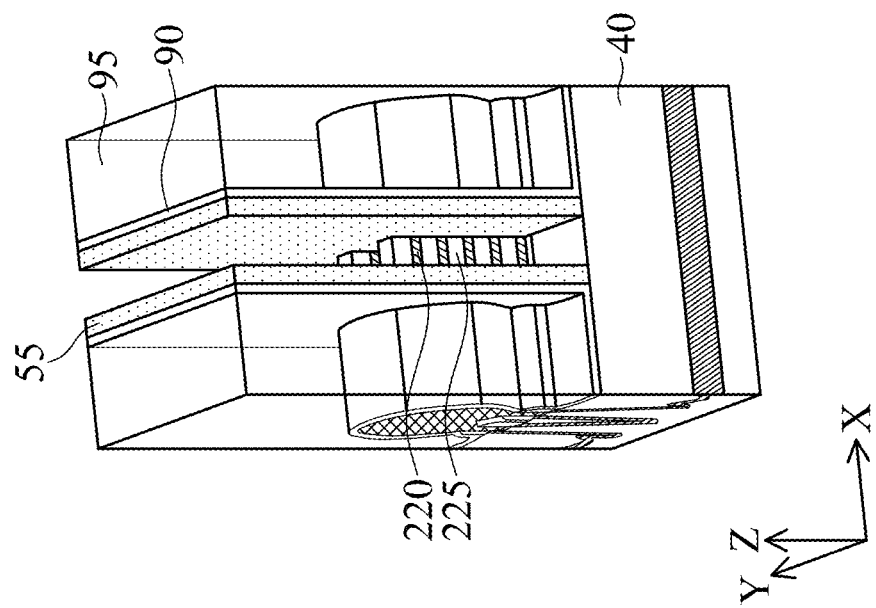
FIG. 28 shows one of the stages of a sequential process for manufacturing a FET device according to an embodiment of the present disclosure.
Figure 27:
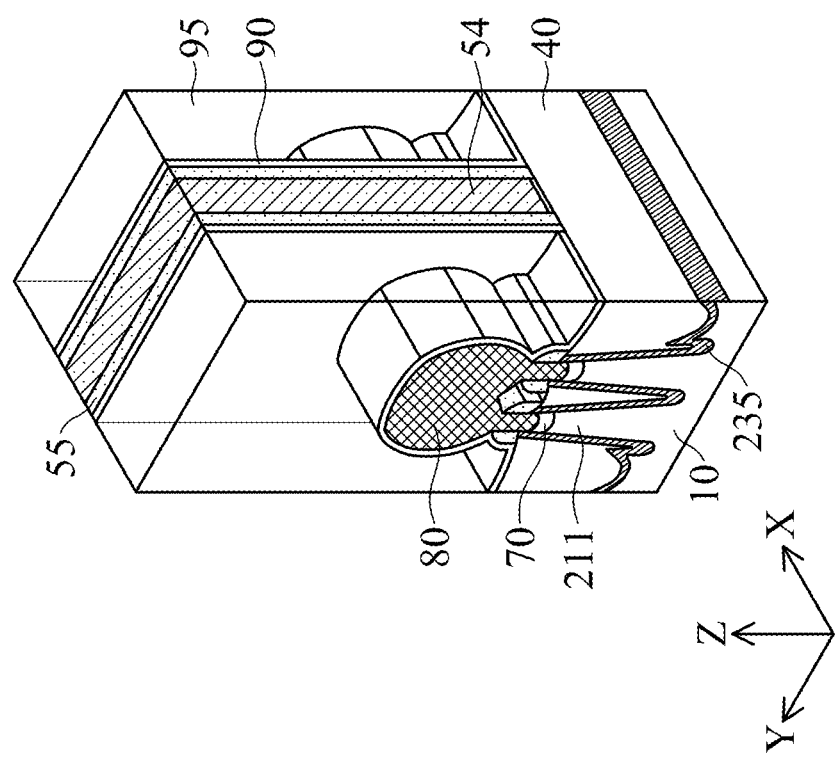
FIG. 27 shows one of the stages of a sequential process for manufacturing a FET device according to an embodiment of the present disclosure.

Then, similar to FIGS. 10 and 11, source/drain (S/D) epitaxial layers 80 are formed, and subsequently, a liner layer (etch stop layer) 90 and an interlayer dielectric (ILD) layer 95 are formed, as shown in FIG. 27. Next, as shown in FIG. 28, the sacrificial gate electrode layer 54 and sacrificial gate dielectric layer 52 are removed, thereby exposing the fin structures.

Figure 29B:
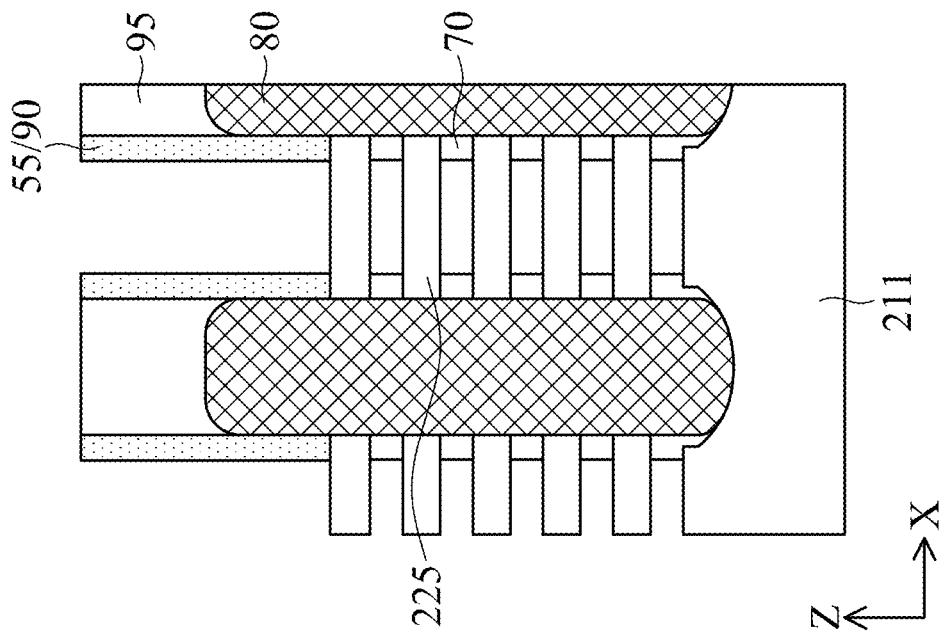
FIGS. 29A and 29B show one of the stages of a sequential process for manufacturing a semiconductor device according to an embodiment of the present disclosure.
Figure 29A:
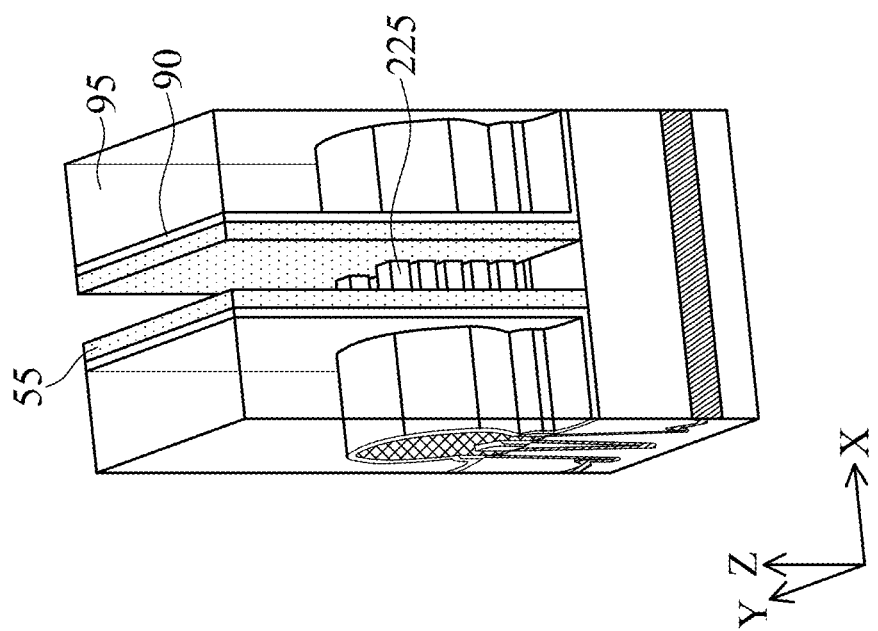

After the sacrificial gate structures are removed, the first semiconductor layers 220 in the fin structures are removed, thereby forming wires or sheets (nano structures) of the second semiconductor layers 225, as shown in FIGS. 29A and 29B. The first semiconductor layers 220 can be removed or etched using an etchant that can selectively etch the first semiconductor layers 220 against the second semiconductor layers 225. When the first semiconductor layers 220 are Ge or SiGe and the second semiconductor layers 225 are Si, the first semiconductor layers 220 can be selectively removed using a wet etchant such as, but not limited to, ammonium hydroxide ($NH_4OH$), tetramethylammonium hydroxide (TMAH), ethylenediamine pyrocatechol (EDP), a hydrochloric acid (HCl) solution, or potassium hydroxide (KOH) solution. The wet etchant further contains one or more of HF, $C_3H_8O_2$ and $C_2H_4O_3$ in some embodiments.

Figure 30B:
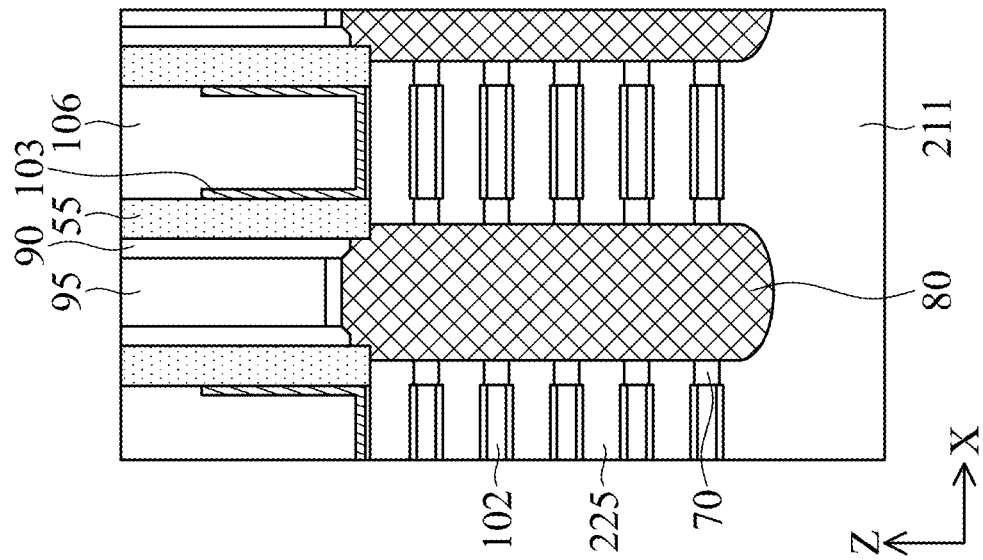
FIGS. 30A and 30B show one of the stages of a sequential process for manufacturing a semiconductor device according to an embodiment of the present disclosure.
Figure 30A:
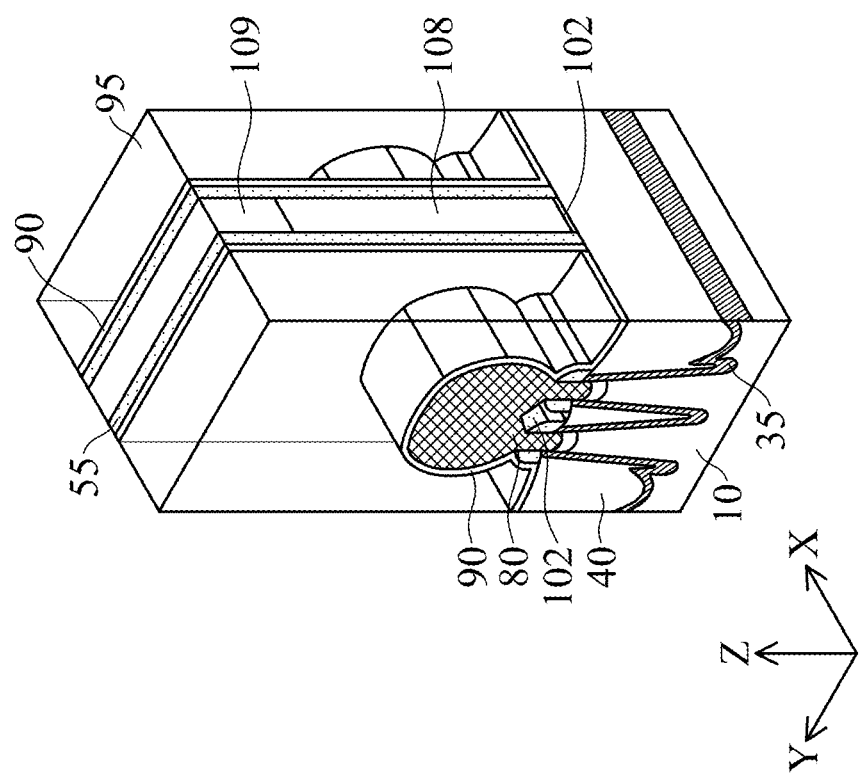

After the wires or sheets of the second semiconductor layers 225 are formed, a gate dielectric layer 102 is formed around each channel layers (wires of the second semiconductor layers 225), and a gate electrode layer 108 is formed on the gate dielectric layer 102, as shown in FIGS. 30A and 30B. The gate replacement operation explained with respect to FIGS. 17A-17F can be employed.

Figure 31:
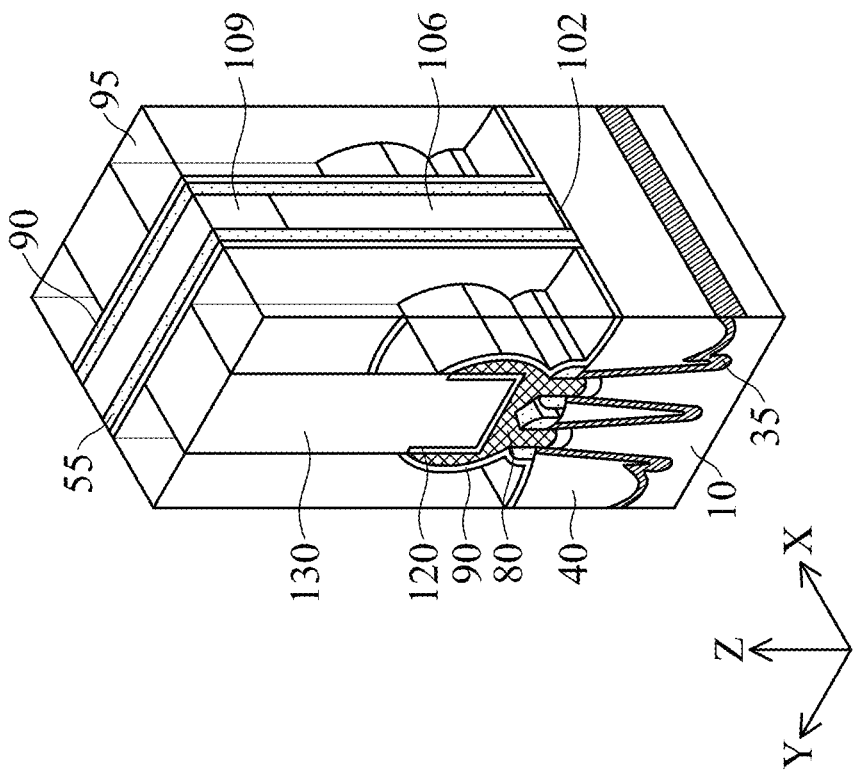
FIG. 31 shows one of the stages of a sequential process for manufacturing a FET device according to an embodiment of the present disclosure.
Figure 32:
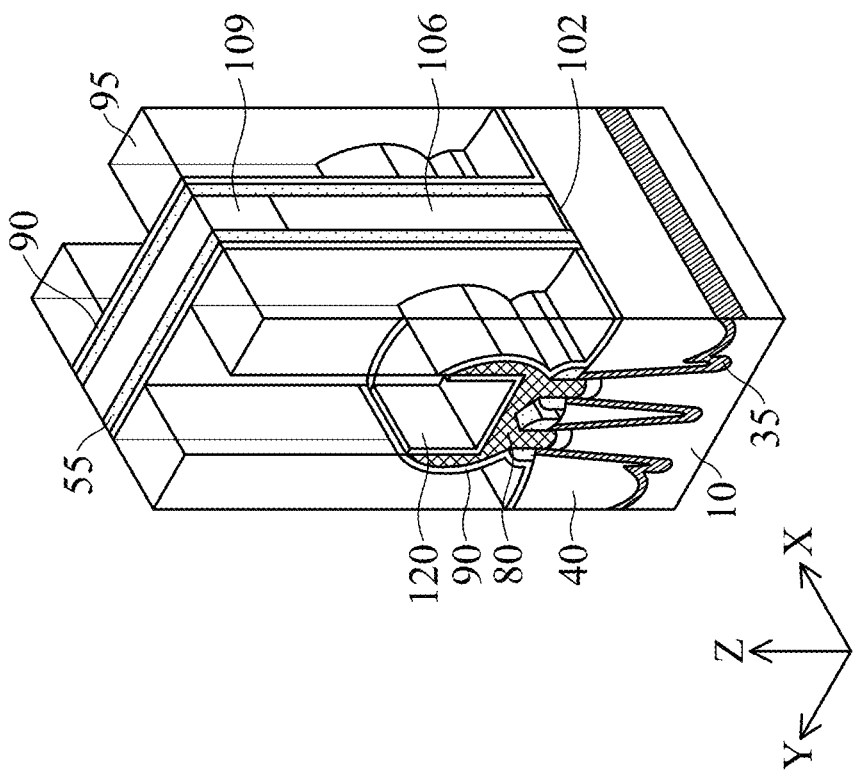
FIG. 32 shows one of the stages of a sequential process for manufacturing a FET device according to an embodiment of the present disclosure.

Subsequently, similar to FIGS. 15 and 16, contact holes 98 are formed in the ILD layer 95 by using dry etching, as shown in FIG. 31, a silicide layer 120 is formed over the S/D epitaxial layer 80, and a conductive material 130 is formed in the contact holes as shown in FIG. 32.

FIGS. 33A-33H show various views of a sequential process for forming a silicide and contact structure according to an embodiment of the present disclosure. It is understood that additional operations can be provided before, during, and after processes shown by FIGS. 33A-33H, and some of the operations described below can be replaced or eliminated, for additional embodiments of the method. The order of the operations/processes may be interchangeable. Materials, configurations, dimensions, and/or processes as described with respect to FIGS. 18A-18H for a Fin FET are applicable to the following embodiments, and the detailed explanation thereof may be omitted.

Figures 33C, 33D:
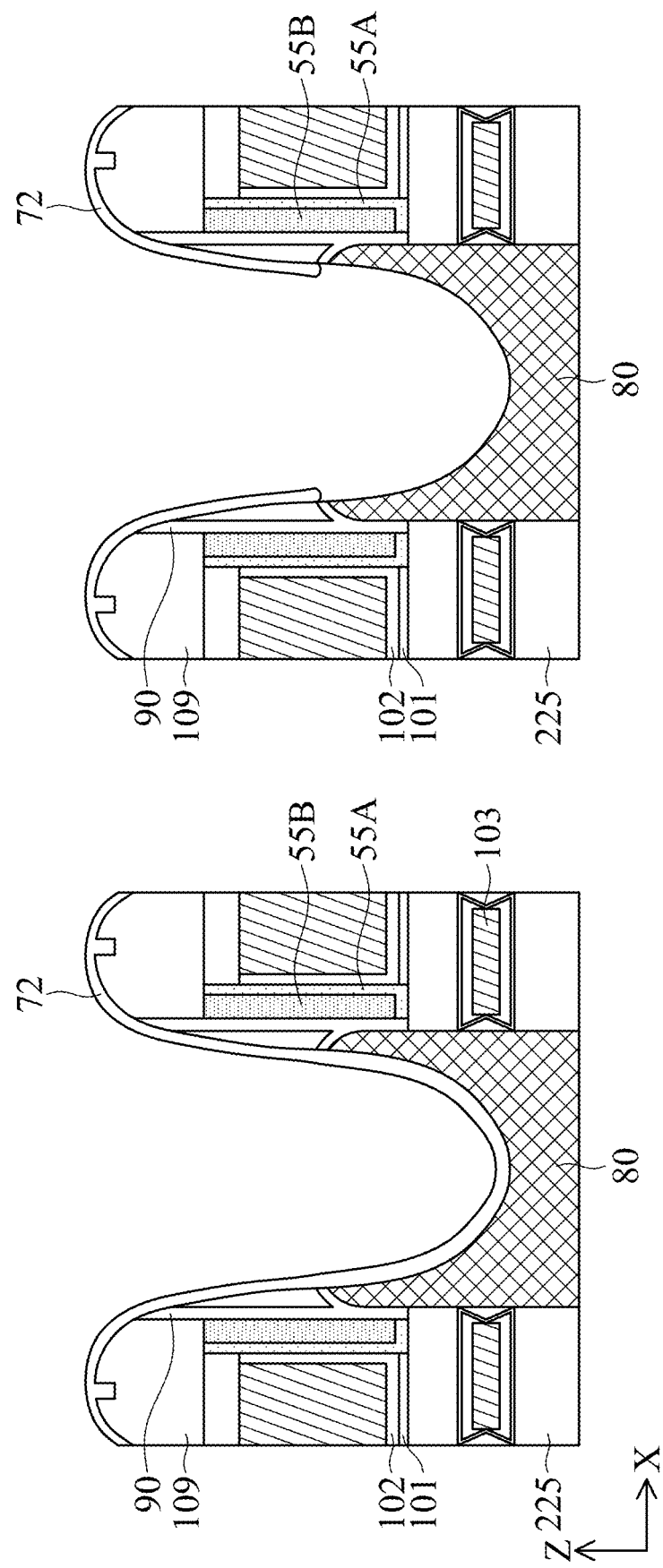

FIG. 33A is an enlarged view of a source/drain region corresponding to FIGS. 30A and 30B of a GAA FET. In FIGS. 33A-33H, a source/drain region disposed between two adjacent gate structures is shown. As shown in FIG. 33B, a contact hole 98 is formed, similar to FIG. 18B. As shown in FIG. 33B, an upper part of the source/drain epitaxial layer 80 is etched in some embodiments. In some embodiments, the cap insulating layer 109 is also etched to form a rounded shape. In some embodiments, the recess 109D remains. In some embodiments, a part of the first ILD layer 95 also remains.

Then, as shown in FIG. 33C, a dielectric cover layer 72 is formed over the etched source/drain epitaxial layer 80 and the cap insulating layer 109, similar to FIG. 18C. In some embodiments, the dielectric cover layer 72 is a silicon nitride layer formed by ALD. As shown in FIG. 33C, the cover layer 72 fully fills the recess 109D on the cap insulating layer 109. In some embodiments, the thickness of the cover layer 72 is in a range from about 1 nm to about 10 nm, and is in a range from about 2 nm to about 5 nm in other embodiments. When the thickness is smaller than these ranges, the recess 109D may not be sufficiently filled, and when the thickness is greater than these ranges, the size of the source/drain contact may become small, which increases contact resistance.

Next, as shown in FIG. 33D, the cover layer 72 is partially removed by etching, similar to FIG. 18D. Since the structure or film property of the cover layer 72 on a semiconductor region (source/drain epitaxial layer 80) are different from those of the cover layer on a dielectric region, a part of the cover layer 72 formed on the source/drain epitaxial layer 80 can be selectively removed.

Figures 33E, 33F:
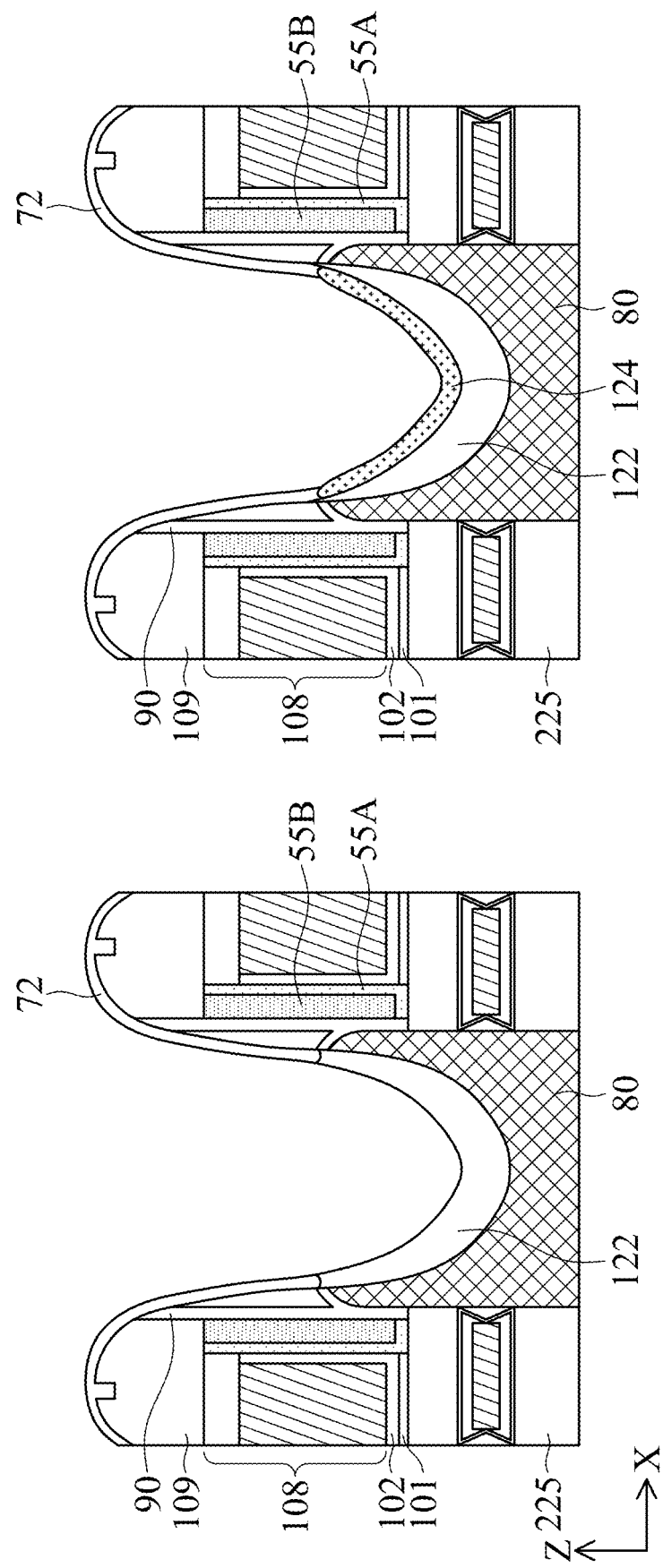

Then, as shown in FIG. 33E, a first silicide layer 122 is formed on the source/drain epitaxial layer 80, similar to FIG. 18E. In some embodiments, the first silicide layer 122 includes a Ni silicide ($NiSi_x$). In some embodiments, a Ni metal layer is formed by sputtering and then an annealing operation is performed to form the Ni silicide layer 122. When there is an un-reacted Ni layer, the un-reacted Ni layer is removed by etching. In some embodiments, the annealing temperature is in a range from about 500° C. to about 700° C.

In some embodiments, the thickness of the Ni silicide layer 122 at the center between two gate structures is in a range from about 5 nm to about 15 nm. In some embodiments, the Ni silicide layer 122 includes platinum (Pt). In some embodiments, a Pt concentration is in a range of about 1 atomic % to about 10 atomic % of the concentration of Ni (Ni %). In some embodiments, a Ni concentration in the Ni silicide layer is in a range from about 20 atomic % to about 60 atomic %, and is in a range from about 35 atomic % to about 45 atomic % in other embodiments. When the amount of Ni is smaller than these ranges, Si in the source/drain epitaxial layer 80 is overconsumed, which may result in epitaxial contamination, and when the amount of Ni is greater than these ranges, it indicates silicon consumption is too low, which may mean that the Ni silicide layer is not formed properly.

Then, as shown in FIG. 33F, a second silicide layer 124 is formed over the first silicide layer 122, similar to FIG. 18F. In some embodiments, the second silicide layer 124 includes titanium-nickel silicide ($TiNiSi_x$).

In some embodiments, a Ti metal layer is formed by sputtering or CVD on the first silicide layer 122. In some embodiments, a CVD process using $TiCl_x$ gas is employed to form the Ti layer. Then, an annealing operation is performed to form the Ti—Ni silicide layer 124. When there is an un-reacted Ti layer, the un-reacted Ti layer is removed by etching. In some embodiments, the annealing temperature for the Ti—Ni silicide layer 124 is lower than the annealing temperature for the Ni silicide layer 122, and is in a range from about 350° C. to about 500° C.

In some embodiments, the thickness of the Ti—Ni silicide layer 124 at the center between the two gate structures is smaller than the thickness of the Ni silicide layer 122, and is in a range from about 2 nm to about 5 nm. In some embodiments, a Ni concentration is greater than a Ti concentration in the Ti—Ni silicide layer 124. In some embodiments, a ratio (Ni/Ti) between the Ni concentration and the Ti concentration is in a range from about 1.01 to about 5, and is in a range from about 1.5 to about 3 in other embodiments.

Next, as shown in FIG. 33G, a barrier or an adhesion layer 126 is formed over the second silicide layer 124 and over the dielectric regions, similar to FIG. 18G. In some embodiments, the layer 126 includes TiN formed by CVD or sputtering. When a CVD process is used, the source gases include $TiCl_x$ as a titanium source and NF or $NH_3$ as a nitrogen source, in some embodiments. In some embodiments, the thickness of the TiN layer 126 is in a range from about 0.5 nm to about 8 nm and is in a range from about 1 nm to about 5 nm in other embodiments.

Subsequently, similar to FIG. 18H, a seed layer 128 is formed over the TiN layer 126 as shown in FIG. 33G, and a source/drain contact layer 130 is formed on the seed layer as shown in FIG. 33H. In some embodiments, the seed layer 128 and the source/drain contact layer 130 are made of cobalt (Co) metal. In some embodiments, the Co seed layer 128 is formed by CVD or PVD. In some embodiments, the thickness of the seed layer 128 is in a range from about 0.2 nm to about 2 nm. Then, the Co source/drain contact layer 130 is formed on the seed layer by electroplating or CVD in some embodiments. In other embodiments, the source/drain contact layer 130 is made of tungsten (W), ruthenium (Ru) or other suitable material. In such cases, an appropriate seed layer is selected.

It is understood that the GAA FETs undergo further CMOS processes to form various features such as contacts/vias, interconnect metal layers, dielectric layers, passivation layers, etc.

Figure 34A:
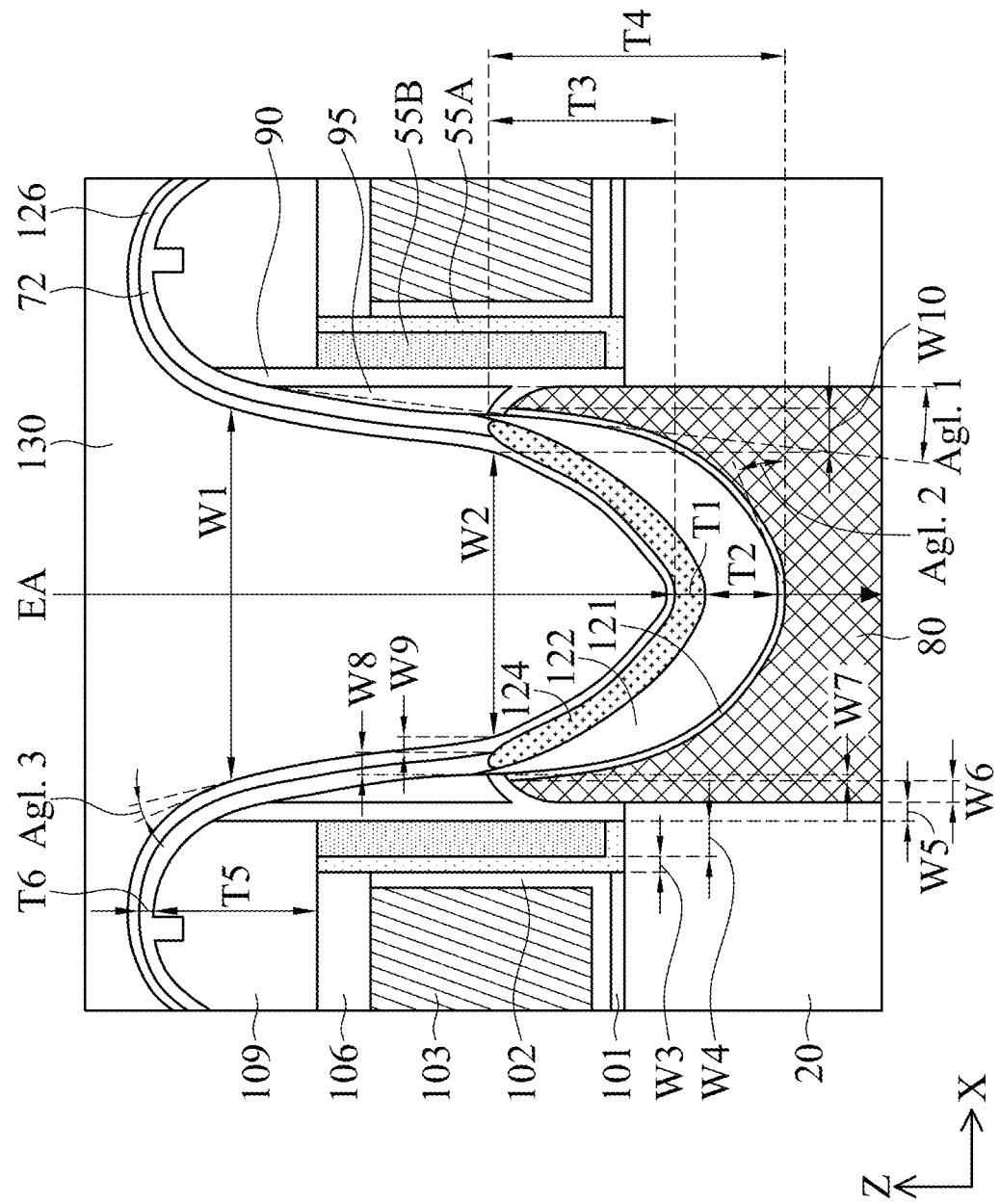
FIGS. 34A, 34B and 34C show dimensional configurations of a Fin FET and a GAA FET, respectively according to embodiments of the present disclosure.
Figure 34B:
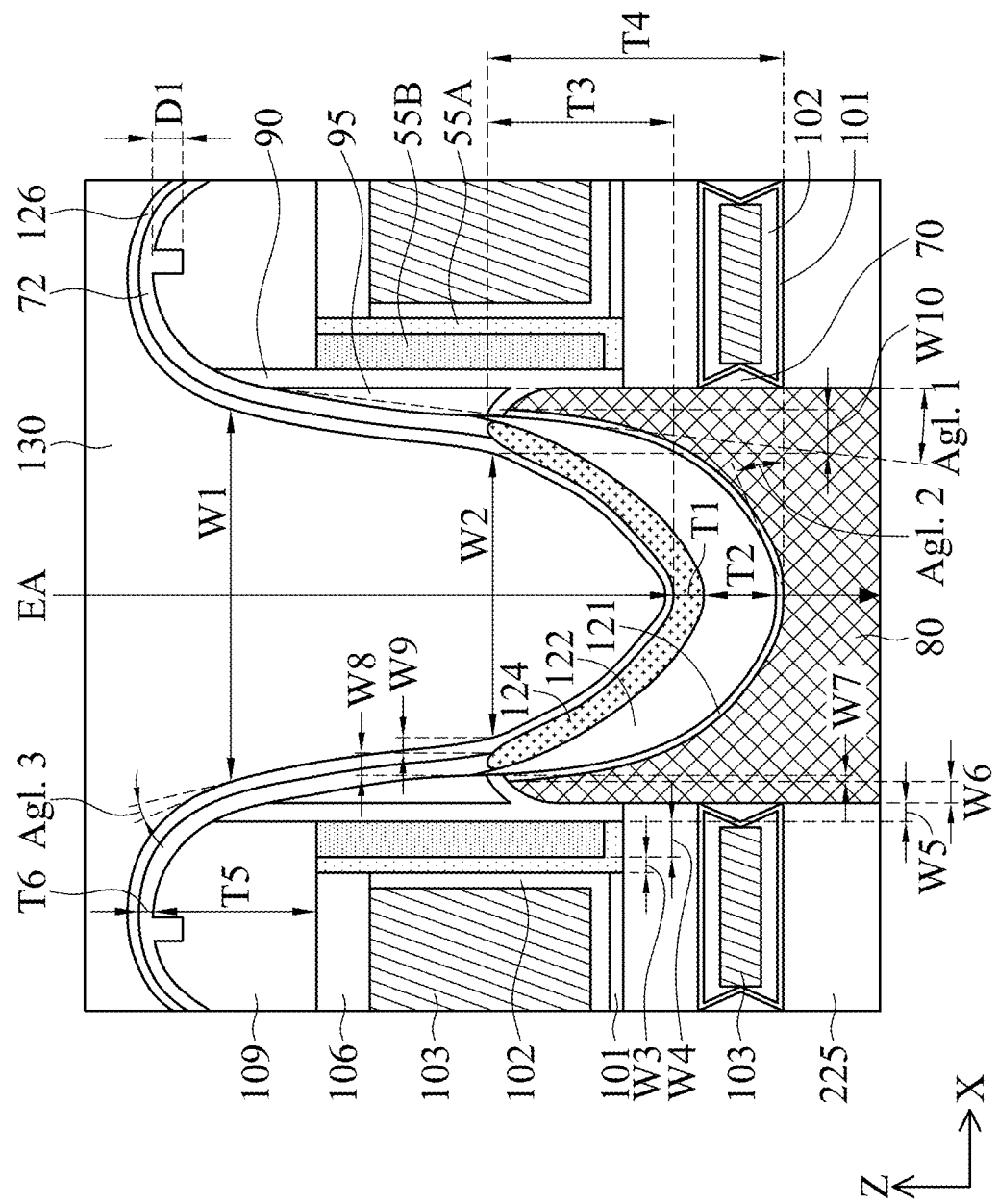

FIGS. 34A and 34B/34C show dimensional configurations of a Fin FET and a GAA FET, respectively. In some embodiments, the thickness T1 of the second silicide layer 124 at the center of the source/drain region is in a range from about 2 nm to about 5 nm, and the thickness T2 of the first silicide layer 122 at the center of the source/drain region is greater than T1 and is in a range from about 5 nm to about 15 nm. In some embodiments, the ratio T2/T1 greater than 1 and less than about 10. Within this range, an appropriate amount of Si in the epitaxial layer 80 is consumed when forming the silicide layer. In some embodiments, the concave amount T3 (from the edge of the silicide layer to the bottom of the TiN layer 126) is in a range from about 0.5 nm to about 20 nm. The thickness T4 is the sum of T1, T2 and T3.

The thickness T5, which is the maximum thickness of the cap insulating layer 109 above the body gate electrode layer 106, is in a range from about 20 nm to about 50 nm, in some embodiments. The thickness T6, which is a thickness of the dielectric cover layer 72 on the gate cap insulating layer 109 other than the filled recess, is in a range from about 0.5 nm to about 5 nm in some embodiments. As shown in FIGS. 34A and 34B, no dielectric cover layer remains between the second silicide layer 124 and the barrier layer 126. In some embodiments, the end of the dielectric cover layer 72 touches the end of the first and/or second silicide layers. In some embodiments, the depth D1 of the recess 109D filled by the dielectric cover layer 72 from the top of the gate cap insulating layer 109 is in a range from about 0.5 nm to about 5 nm.

In some embodiments, the width W1, which is the width of the source/drain contact 130 measured at the level equal to the top of the insulating liner (etch stop) layer 90, is in a range from about 10 nm to about 30 nm. In some embodiments, the width W2, which is the width of the source/drain contact 130 measured at the level equal to the top of the second silicide layer 124, is in a range from about 5 nm to about 20 nm. W10 is the width or thickness of the silicide layer 122/124 at the top thereof.

In some embodiments, the width or thickness W3 of the first layer 55A of the gate sidewall spacer is in a range from about 1 nm to about 3 nm, and the width or thickness W4 of the second layer 55B of the gate sidewall spacer is in a range from about 1 nm to about 5 nm.

In some embodiments, the width or thickness W5 of the insulating liner (etch stop) layer 90 is in a range from about 0.5 nm to about 3 nm. In some embodiments, the width or thickness W6, which is the maximum lateral thickness of the ILD layer 95, is in a range from about 0.5 nm to about 5 nm.

In some embodiments, the width or thickness W7, which is the lateral thickness of the first silicide layer 122 at the level equal to the top of the first silicide layer 122, is in a range from about 0.5 nm to about 5 nm. In some embodiments, the width or thickness W8, which is the lateral thickness of the dielectric cover layer 72 at the level equal to the top of the second silicide layer 124, is in a range from about 0.5 nm to about 5 nm. In some embodiments, the width or thickness W9, which is the lateral thickness of the barrier layer 126 at the level equal to the top of the second silicide layer 124, is in a range from about 0.5 nm to about 8 nm.

In some embodiments, an angle Agl. 1 formed by a tangent line of the interface between the ILD layer 95 and the dielectric cover layer 72 at the top of the etch stop layer 90 and a vertical side face of the etch stop layer 90 is in a range from about 20 degrees to about 70 degrees. In some embodiments, an angle Agl. 2 formed by a horizontal line and a tangent line of the interface between the epitaxial layer 80 and the first silicide layer 122 at the bottom of the first silicide layer 122 is in a range from about 5 degrees to about 60 degrees. In some embodiments, an angle Agl. 3 between a tangent line of an ascending profile of the barrier layer 126 and a tangent line of a descending profile of the barrier layer 126 is in a range from about 5 degrees to about 80 degrees.

When the thickness W9 of the barrier layer 126 is greater than these ranges, a cobalt layer for the source/drain contact may not fully fill the space between the gate structures. When the thickness of the barrier layer 126 is smaller than these ranges, a cobalt layer may penetrate into the silicide layer and/or the source/drain epitaxial layer.

Figure 34C:
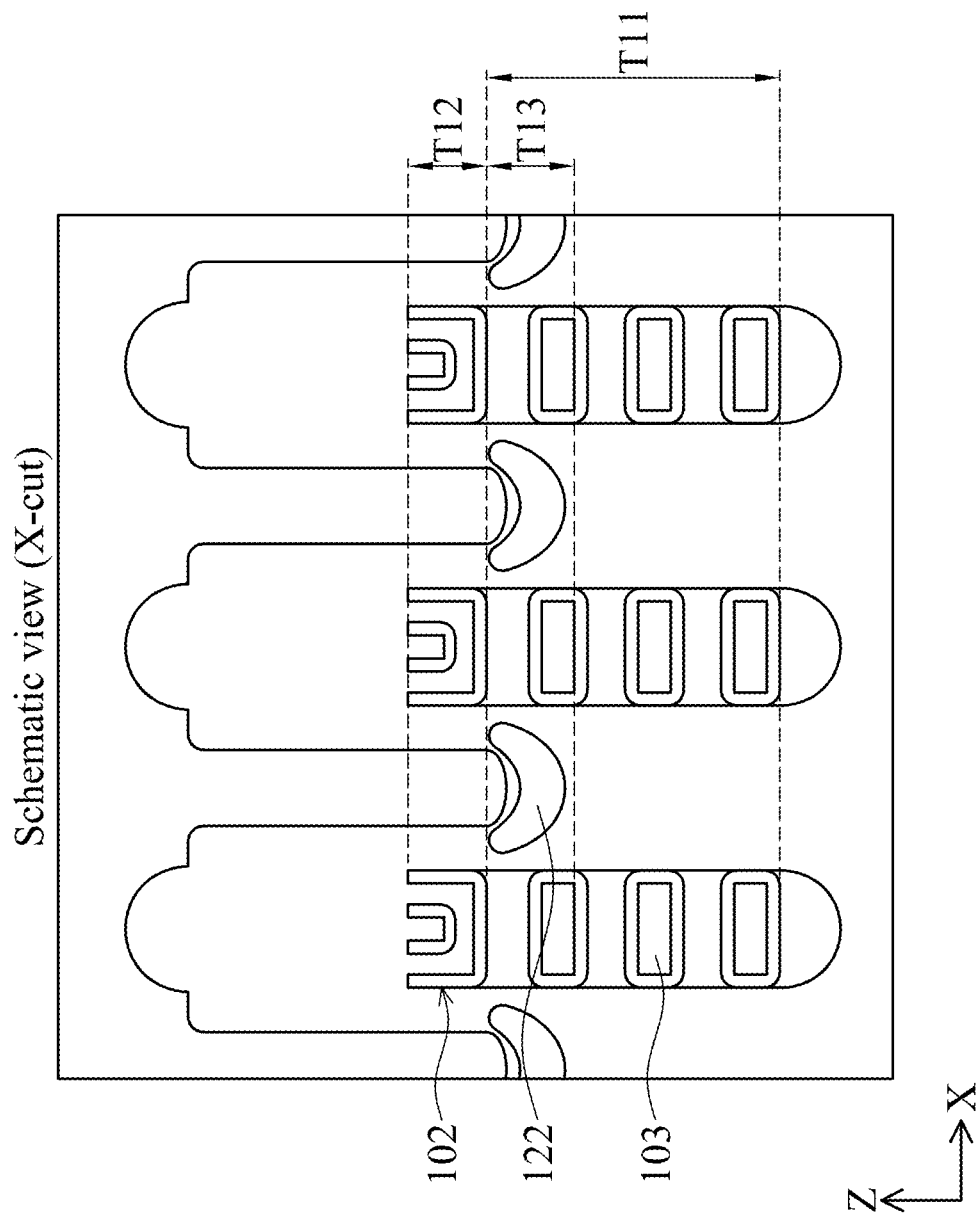

As shown in FIG. 34C, the thickness or depth T11 from the bottom of the gate dielectric layer wrapping around the bottommost one of the wires or sheets 225 to the top surface of the uppermost one of the wires or sheets 225 is in a range from about 30 nm to about 80, in some embodiments. In some embodiments, the height T12 of the metal gate structure (to the top of the gate dielectric layer 102) is in a range from about 10 nm to about 40 nm. In some embodiments, the entire depth T13 of the silicide layer 122/124 is in a range from about 3 nm to about 15 nm. When the depth T13 is out of the range, the source/drain contact resistance may increase. In some embodiments, the entire silicide layer 122/124 is located below the bottom of the gate structure (bottom of the gate dielectric layer 102 or the interfacial layer 101).

In some embodiments, the ratio T13/W10 is in a range from about 1 to about 5. Within this range, an appropriate amount of Si in the epitaxial layer 80 is consumed when forming the silicide layer. When the ratio is greater than this range, the source/drain contact 130 may penetrate into the source/drain epitaxial layer 80, which may increase the contact resistance. When the ratio is smaller than this range, the silicide layer may extend into the channel region.

Figure 35A:
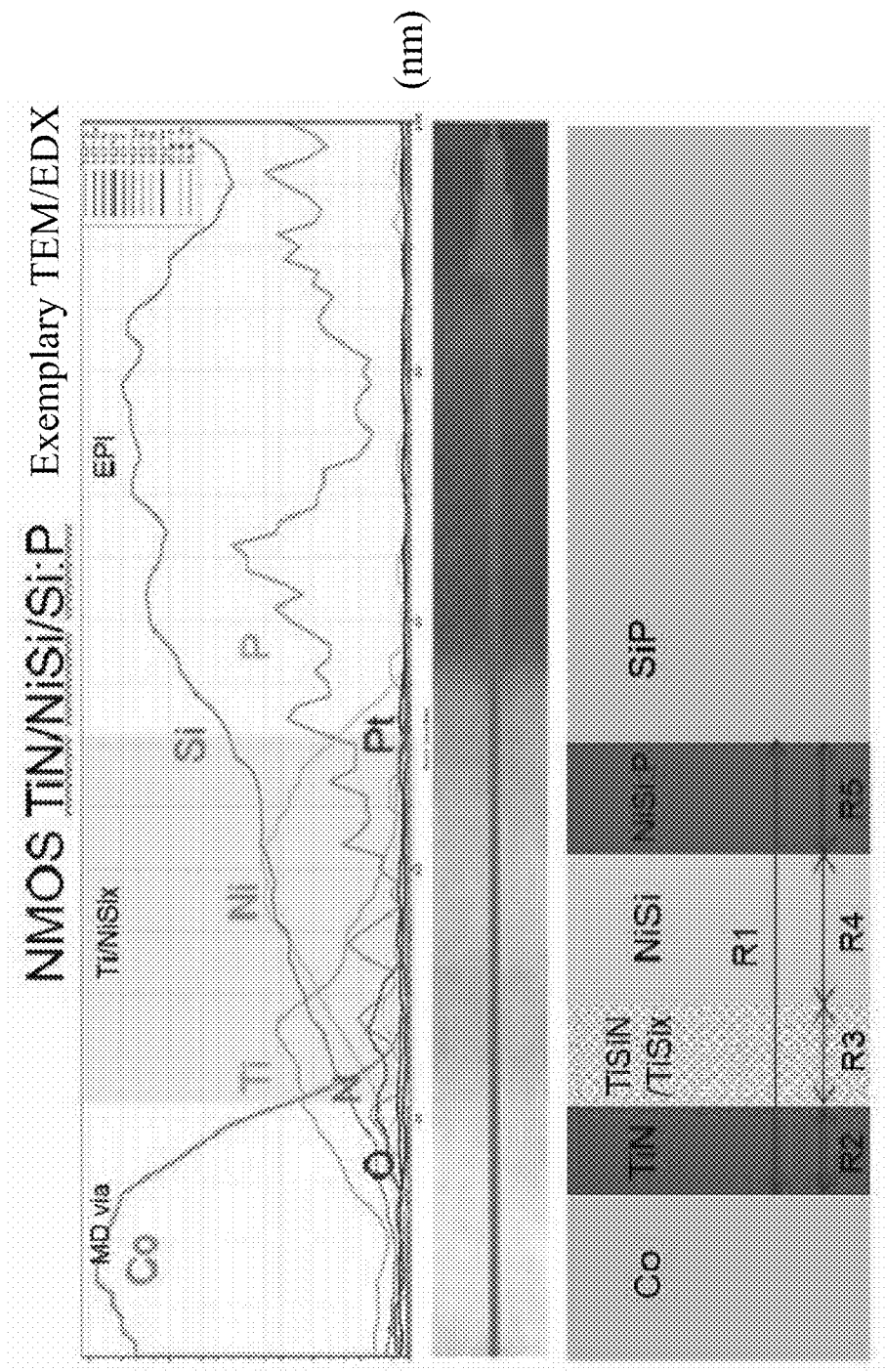
FIGS. 35A and 35B show elemental analysis (EDX) results of source/drain regions of an n-type FET and a p-type FET, respectively, according to embodiments of the present disclosure.
Figure 35B:
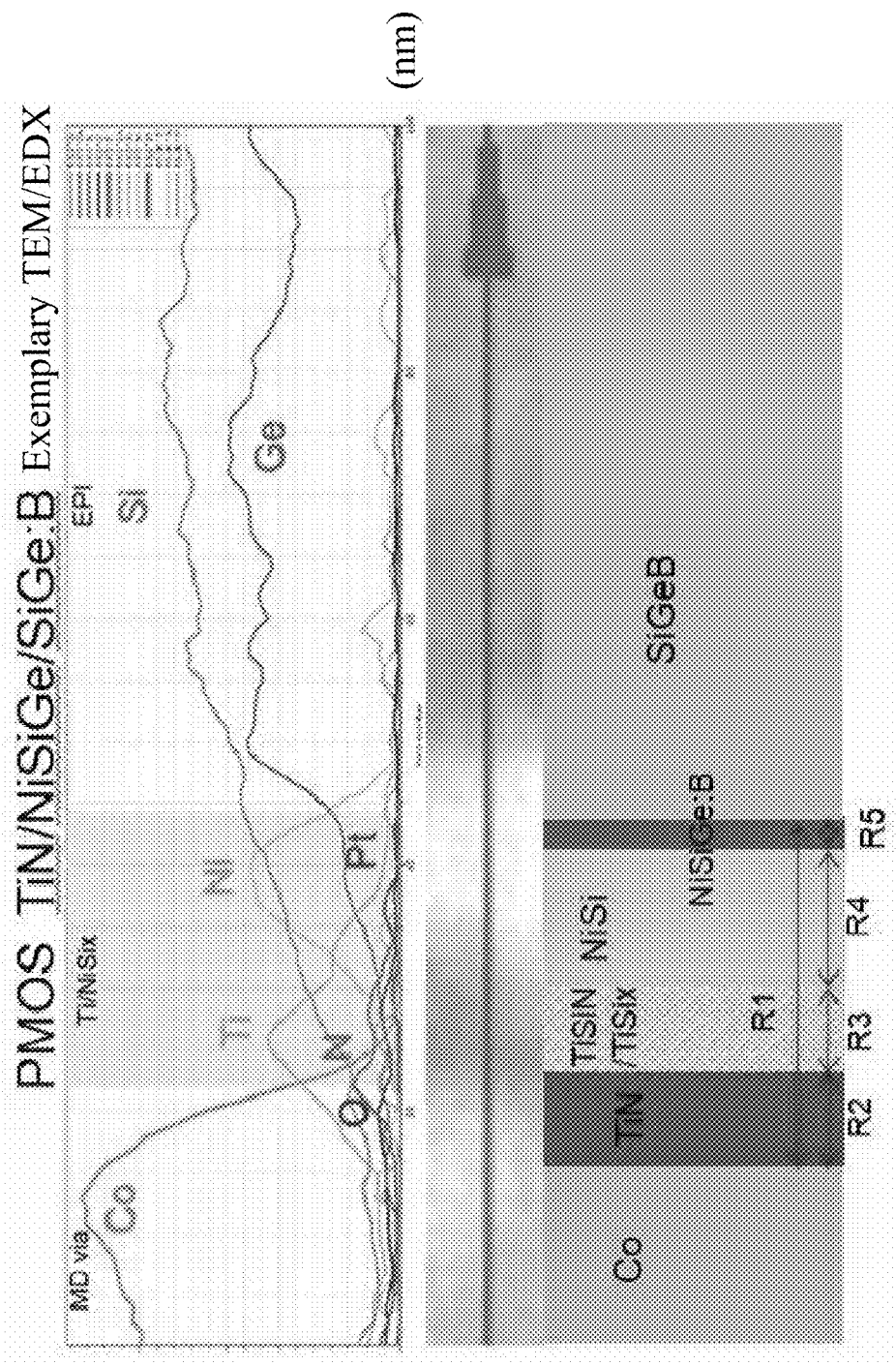

FIGS. 35A and 35B show elemental analysis (EDX) results of source/drain regions of an n-type FET (FIG. 35A) and a p-type FET (FIG. 35B) along the line EA shown in FIGS. 34A and 34B, according to embodiments of the present disclosure.

In some embodiments, as shown in FIG. 35A, the source/drain epitaxial layer of the n-type FET includes SiP, the Ni silicide layer including P (interfacial silicide layer 121) is formed between the SiP layer and the Ni silicide layer (first silicide layer), the Ti—Ni silicide layer (second silicide layer) is formed on the Ni silicide layer, the TiN barrier layer is formed on the Ti—Ni silicide layer and the Co contact layer is formed on the Ti—Ni silicide layer. In some embodiments, the second silicide layer includes a Ti—Ni silicide layer and a Ti silicide layer (no nickel) on the Ti—Ni silicide layer.

In some embodiments, the concentration ratio of Si/Ni in the silicide layers ranges from about 1 to about 10. In some embodiments, the concentration ratio of Ti/Si in the Ti—Ni silicide layer ranges from about 1 to about 10. In some embodiments, the concentration ratio of Co/Ni ranges from about 30 to about 70 in the source/drain region. In some embodiments, the total volume of the Ti—Ni silicide (second silicide layer) in the entire FET is smaller than the total volume of the Ni silicide layer (first silicide layer) in the entire FET. In some embodiments, the thickness R1 of the total silicide layers is about 30 nm to about 50 nm, the thickness R2 of the TiN barrier layer is about 5 nm to about 15 nm, the thickness of the second silicide layer R3 is about 5 nm to about 15 nm, the thickness of the first silicide layer R4 is about 5 nm to about 25 nm and the thickness of the interfacial silicide layer R5 is about 5 nm to about 20 nm.

In some embodiments, as shown in FIG. 35B, the source/drain epitaxial layer of the p-type FET includes SiGe doped with B (SiGe:B), the Ni silicide layer including Ge and B (interfacial silicide layer 121) is formed between the SiGe:B layer and the Ni silicide layer (first silicide layer), the Ti—Ni silicide layer (second silicide layer) is formed on the Ni silicide layer, the TiN barrier layer is formed on the Ti—Ni silicide layer and the Co contact layer is formed on the Ti—Ni silicide layer. In some embodiments, the second silicide layer includes a Ti—Ni silicide layer and a Ti silicide layer (no nickel) on the Ti—Ni silicide layer.

In some embodiments, the concentration ratio of Si/Ni in the silicide layers ranges from about 1 to about 10. In some embodiments, the concentration ratio of Ti/Si in the Ti—Ni silicide layer ranges from about 1 to about 10. In some embodiments, the concentration ratio of Co/Ni ranges from about 30 to about 70 in the source/drain region. In some embodiments, the total volume of the Ti—Ni silicide (second silicide layer) in the entire FET is smaller than the total volume of the Ni silicide layer (first silicide layer) in the entire FET. In some embodiments, the thickness R1 of the total silicide layers is about 30 nm to about 50 nm, the thickness R2 of the TiN barrier layer is about 5 nm to about 15 nm, the thickness of the second silicide layer R3 is about 5 nm to about 15 nm, the thickness of the first silicide layer R4 is about 5 nm to about 25 nm and the thickness of the interfacial silicide layer R5 is about 3 nm to about 15 nm.

In some embodiments, the silicide thickness (R2+R3+R4+R5) of the n-type FET is greater than the silicide thickness (R2+R3+R4+R5) of the p-type FET, because Si consumption in the n-type FET is greater than that in the p-type FET. In particular, the thickness of the interfacial silicide layer in the n-type FET is greater than that in the p-type FET. In some embodiments, the ratio between the silicide thickness of the p-type FET and the silicide thickness of the n-type FET is about 0.5 or more and less than about 1. In some embodiments, the silicide layers of the n-type FET and the p-type FET in a CMOS device are formed at the same time, which can reduce the manufacturing cost. In other embodiments, the silicide layers of the n-type FET and the p-type FET in a CMOS device are separately formed, which can optimize the contact resistance for the respective devices.

Figure 36:
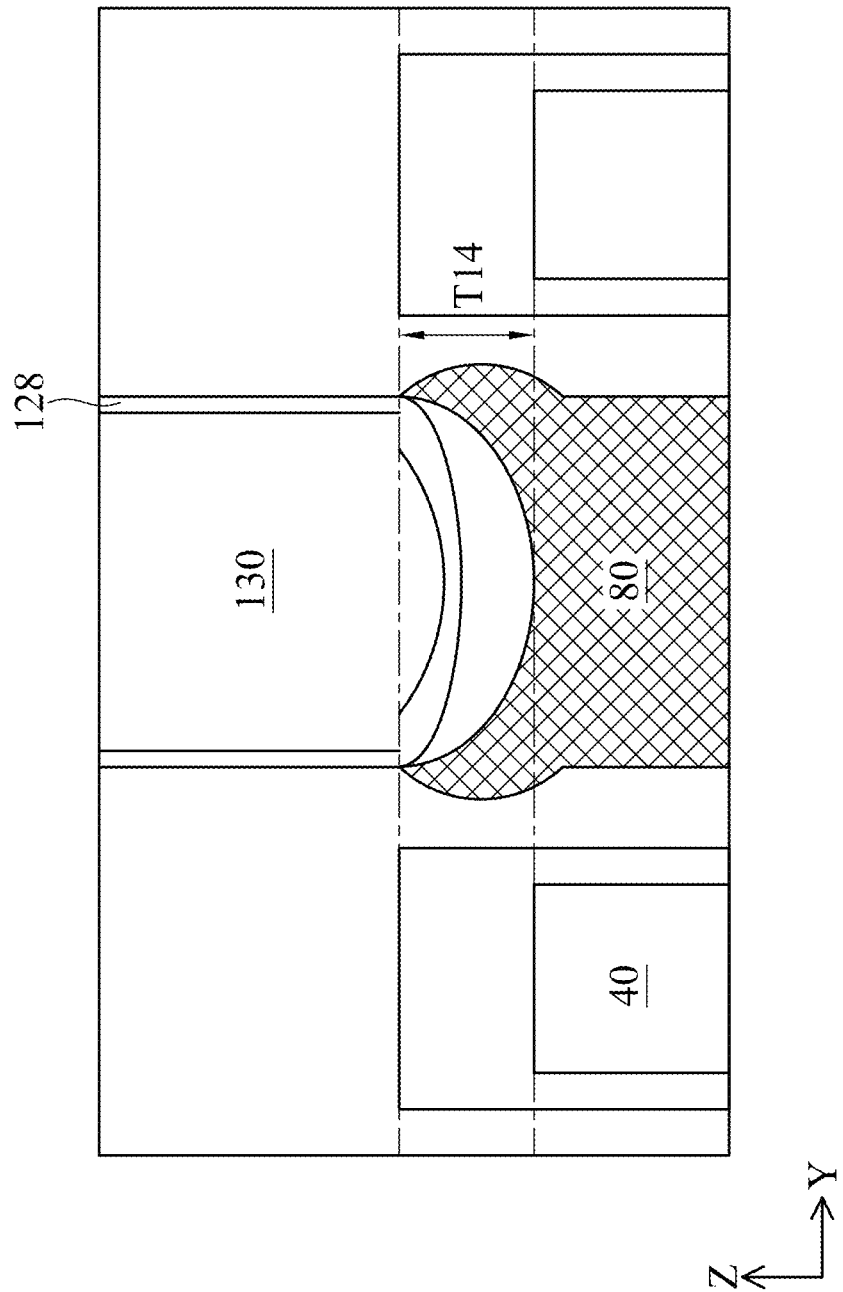
FIG. 36 shows a cross sectional view of an FET according to embodiments of the present disclosure.

FIG. 36 shows a cross sectional view along the Y direction of the source/drain region according to an embodiment of the present disclosure.

In some embodiments, a hybrid fin or a dummy fin is formed between adjacent source/drain regions as shown in FIG. 36. In some embodiments, the hybrid fin includes one or more layers of SiN, SiCN, SiON, SiOCN, SiOC, high-k dielectric (e.g., hafnium oxide) or any other suitable material.

As shown in FIG. 36, since Ni penetration in the Si epitaxial layer is higher than that of Ti, the Ni silicide induces a concave profile at the upper surface of the source/drain epitaxial layer 80 in some embodiments. In some embodiments, the thickness at the center of the silicide layer (e.g., about 0.5 nm to about 5 nm) is greater than that at the edges thereof. In some embodiments, the Ti—Ni silicide layer and/or the TiN layer function as a barrier layer to suppress Ni (or Co) diffusion or extrusion into the gate electrode. In some embodiments, the silicide layers are formed above the isolation insulating layer 40 (STI) so that the contact landing in later steps can be aligned properly. In some embodiments, when the second silicide layer includes a Ti—Ni silicide layer and a Ti silicide layer (no nickel) on the Ti—Ni silicide layer, the thickness of the Ti—Ni silicide layer is greater than the thickness of the Ti silicide layer so that the silicide mainly fills in via bottom and not on the via side walls, which can create a good step coverage between the Co contact and the epitaxial layer. In some embodiments, the silicide layer thickness T14 is smaller than the thickness of the hybrid fin above the isolation insulating layer 40.

The various embodiments or examples described herein offer several advantages over the existing art. In the embodiments of the present disclosure, since the silicide layer includes two layers of different materials, it is possible to decrease a contact resistance of a source/drain contact.

It will be understood that not all advantages have been necessarily discussed herein, no particular advantage is required for all embodiments or examples, and other embodiments or examples may offer different advantages.

In accordance with one aspect of the present disclosure, in a method of manufacturing a semiconductor device, a source/drain epitaxial layer is formed, one or more dielectric layers are formed over the source/drain epitaxial layer, an opening is formed in the one or more dielectric layers to expose the source/drain epitaxial layer, a first silicide layer is formed on the exposed source/drain epitaxial layer, a second silicide layer different from the first silicide layer is formed on the first silicide layer, and a source/drain contact is formed over the second silicide layer. In one or more of the forgoing and following embodiments, the first silicide layer is a nickel silicide layer and the second silicide layer is a titanium-nickel silicide layer. In one or more of the forgoing and following embodiments, a nickel concentration in the first silicone layer is in a range from 20 atomic % to 60 atomic %. In one or more of the forgoing and following embodiments, a nickel concentration in the second silicide layer is greater than a titanium concentration in the second silicide layer. In one or more of the forgoing and following embodiments, a ratio Ni/Ti in the second silicide layer is in a range from 1.01 to 5. In one or more of the forgoing and following embodiments, a thickness of the first silicide layer is greater than a thickness of the second silicide layer. In one or more of the forgoing and following embodiments, after the opening is formed, an upper surface of the exposed source/drain epitaxial layer has a concave shape, and an upper surface of each of the first and second silicide layers has a concave shape. In one or more of the forgoing and following embodiments, an interfacial silicide layer is formed between the first silicide layer and the source/drain epitaxial layer.

In accordance with another aspect of the present disclosure, in a method of manufacturing a semiconductor device, a source/drain epitaxial layer is formed, one or more dielectric layers are formed over the source/drain epitaxial layer, an opening is formed in the one or more dielectric layers to expose the source/drain epitaxial layer, a dielectric cover layer is formed on the exposed source/drain epitaxial layer and a sidewall of the opening of the one or more dielectric layer, a part of the dielectric cover layer formed on the exposed source/drain epitaxial layer is selectively removed, a first silicide layer is formed on the exposed source/drain epitaxial layer, a second silicide layer different from the first silicide layer is formed on the first silicide layer, and a source/drain contact is formed over the second silicide layer. In one or more of the forgoing and following embodiments, the dielectric cover layer includes silicon nitride. In one or more of the forgoing and following embodiments, a thickness of the dielectric cover layer is in a range from 1 nm to 10 nm. In one or more of the forgoing and following embodiments, the dielectric cover layer is formed by atomic layer deposition. In one or more of the forgoing and following embodiments, a barrier layer is formed before the source/drain contact is formed. In one or more of the forgoing and following embodiments, part of the dielectric cover layer not removed by the selectively removing a part of the dielectric cover layer is disposed between the sidewall of the opening and the barrier layer. In one or more of the forgoing and following embodiments, the barrier layer includes titanium nitride and the source/drain contact includes cobalt. In one or more of the forgoing and following embodiments, after the barrier layer is formed, the dielectric cover layer contacts an edge of at least one of the first silicide layer or the second silicide layer.

In accordance with another aspect of the present disclosure, in a method of manufacturing a semiconductor device, a first gate structure and a second gate structure are formed. Each of the first and second gate structures includes a gate dielectric layer, a gate electrode layer, a sidewall spacer layer, a cap insulating layer disposed on the gate electrode layer and the sidewall spacer layer. A source/drain epitaxial layer is formed, one or more dielectric layers are formed over the source/drain epitaxial layer, an opening is formed in the one or more dielectric layers to expose the source/drain epitaxial layer, a dielectric cover layer is formed on the exposed source/drain epitaxial layer and a sidewall of the opening of the one or more dielectric layers, a part of the dielectric cover layer formed on the exposed source/drain epitaxial layer is selectively removed, a first silicide layer is formed on the exposed source/drain epitaxial layer, a second silicide layer different from the first silicide layer is formed on the first silicide layer, and a source/drain contact is formed over the second silicide layer. An upper surface of the cap insulating layer includes a recess and the dielectric cover layer fills the recess. In one or more of the forgoing and following embodiments, the first silicide layer is a nickel silicide layer and the second silicide layer is a titanium-nickel silicide layer. In one or more of the forgoing and following embodiments, a thickness of the first silicide layer at a center between the first and second gate structures is greater than a thickness of the second silicide layer at the center. In one or more of the forgoing and following embodiments, the thickness of the first silicide layer at the center is in a range from 5 nm to 15 nm. In one or more of the forgoing and following embodiments, the thickness of the second silicide layer at the center is in a range from 2 nm to 5 nm.

In accordance with another aspect of the present disclosure, a semiconductor device includes a plurality of semiconductor bodies disposed and vertically arranged over a substrate, each of the plurality of semiconductor bodies including a channel region, a gate dielectric layer disposed on and wrapping around the channel region of each of the plurality of semiconductor bodies, a gate electrode layer disposed on the gate dielectric layer and wrapping around each channel region, a source/drain region including a source/drain epitaxial layer, and a source/drain contact contacting the source/drain epitaxial layer. A first silicide layer is disposed on the source/drain epitaxial layer, and a second silicide layer different from the first silicide layer is disposed on the first silicide layer. In one or more of the forgoing and following embodiments, the first silicide layer is a nickel silicide layer and the second silicide layer is a titanium-nickel silicide layer. In one or more of the forgoing and following embodiments, a nickel concentration in the first silicide layer is in a range from 20 atomic % to 60 atomic %. In one or more of the forgoing and following embodiments, a nickel concentration in the second silicide layer is greater than a titanium concentration in the second silicide layer. In one or more of the forgoing and following embodiments, a ratio Ni/Ti in the second silicide layer is in a range from 1.01 to 5. In one or more of the forgoing and following embodiments, a thickness of the first silicide layer is greater than a thickness of the second silicide layer. In one or more of the forgoing and following embodiments, a barrier layer is disposed between the source/drain contact and the second silicide layer. In one or more of the forgoing and following embodiments, the barrier layer is made of titanium nitride and has a thickness in a range from 0.5 nm to 8 nm. In one or more of the forgoing and following embodiments, an upper surface of the exposed source/drain epitaxial layer has a concave shape, and an upper surface of each of the first and second silicide layers has a concave shape. In one or more of the forgoing and following embodiments, a bottom of the first silicide layer is located between an uppermost one of the plurality of semiconductor bodies and a second uppermost one of the plurality of semiconductor bodies.

In accordance with another aspect of the present disclosure, a semiconductor device includes a fin structure protruding from a semiconductor substrate and including a channel region and a source/drain region having a recess, a gate structure disposed over the channel region, the gate structure including a gate dielectric layer, a gate electrode layer, a sidewall spacer layer, a cap insulating layer disposed on the gate electrode layer and the sidewall spacer layer, a source/drain epitaxial layer disposed on the recess of the source/drain region, a source/drain contact contacting the source/drain epitaxial layer, and a dielectric cover layer disposed between the source/drain contact and the cap insulating layer. A first silicide layer is disposed on the source/drain epitaxial layer, and a second silicide layer different from the first silicide layer is disposed on the first silicide layer. In one or more of the forgoing and following embodiments, the dielectric cover layer includes silicon nitride. In one or more of the forgoing and following embodiments, a thickness of the dielectric cover layer covering the cap insulating layer is in a range from 1 nm to 10 nm. In one or more of the forgoing and following embodiments, an upper surface of the cap insulating layer include a recess, and the dielectric cover layer fully fills the recess. In one or more of the forgoing and following embodiments, the semiconductor device further includes a barrier layer between the source/drain contact and the dielectric cover layer. In one or more of the forgoing and following embodiments, a part of the barrier layer contacts the second silicide layer. In one or more of the forgoing and following embodiments, the semiconductor device further includes an etch stop layer disposed on a side face of the gate sidewall spacer layer and the cap insulating layer, and an interlayer dielectric (ILD) layer disposed between the etch stop layer and the dielectric cover layer.

In accordance with another aspect of the present disclosure, a semiconductor device includes an n-type FET and p-type FET. Each of the n-type FET and p-type FET includes a fin structure protruding from a semiconductor substrate and including a channel region and a source/drain region having a recess, a gate structure disposed over the channel region, the gate structure including a gate dielectric layer, a gate electrode layer, a sidewall spacer layer, a cap insulating layer disposed on the gate electrode layer and the sidewall spacer layer, a source/drain epitaxial layer disposed on the recess of the source/drain region, a source/drain contact contacting the source/drain epitaxial layer, and a dielectric cover layer disposed between the source/drain contact and the cap insulating layer. An interfacial silicide layer is disposed on the source/drain epitaxial layer, a first silicide layer is disposed on the interfacial silicide layer, a second silicide layer different from the first silicide layer is disposed on the first silicide layer, and a thickness of the interfacial silicide layer of the n-type FET is greater than a thickness of the interfacial silicide layer of the p-type FET. In one or more of the forgoing and following embodiments, the first silicide layer is a nickel silicide layer and the second silicide layer is a titanium-nickel silicide layer. In one or more of the forgoing and following embodiments, the interfacial silicide layer of the n-type FET includes phosphorous, and the interfacial silicide layer of the p-type FET includes boron.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device comprising:
    a plurality of semiconductor bodies disposed and vertically arranged over a substrate, each of the plurality of semiconductor bodies including a channel region;
    a gate dielectric layer disposed on and wrapping around the channel region of each of the plurality of semiconductor bodies;
    a gate electrode layer disposed on the gate dielectric layer and wrapping around each channel region;
    a source/drain region including a source/drain epitaxial layer; and
    a source/drain contact disposed over and in electrical contact with the source/drain epitaxial layer, wherein:
    a first silicide layer is disposed on the source/drain epitaxial layer, and
    a second silicide layer different from the first silicide layer is disposed on the first silicide layer.

2. The semiconductor device of claim 1, wherein the first silicide layer is a nickel silicide layer and the second silicide layer is a titanium-nickel silicide layer.

3. The semiconductor device of claim 2, wherein a nickel concentration in the first silicide layer is in a range from 20 atomic % to 60 atomic %.

4. The semiconductor device of claim 2, wherein a nickel concentration in the second silicide layer is greater than a titanium concentration in the second silicide layer.

5. The semiconductor device of claim 4, wherein a ratio Ni/Ti in the second silicide layer is in a range from 1.01 to 5.

6. The semiconductor device of claim 2, wherein a thickness of the first silicide layer is greater than a thickness of the second silicide layer.

7. The semiconductor device of claim 1, wherein a barrier layer is disposed between the source/drain contact and the second silicide layer.

8. The semiconductor device of claim 7, wherein the barrier layer is made of titanium nitride and has a thickness in a range from 0.5 nm to 8 nm.

9. The semiconductor device of claim 1, wherein:
    an upper surface of the source/drain epitaxial layer has a concave shape, and
    an upper surface of each of the first and second silicide layers has a concave shape.

10. The semiconductor device of claim 9, wherein a bottom of the first silicide layer is located between an uppermost one of the plurality of semiconductor bodies and a second uppermost one of the plurality of semiconductor bodies.

11. A semiconductor device comprising:
    a fin structure protruding from a semiconductor substrate and including a channel region and a source/drain region having a recess;
    a gate structure disposed over the channel region, the gate structure including a gate dielectric layer, a gate electrode layer, a sidewall spacer layer, a cap insulating layer disposed on the gate electrode layer and the sidewall spacer layer;
    a source/drain epitaxial layer disposed on the recess of the source/drain region;
    a source/drain contact disposed over and in electrical contact with the source/drain epitaxial layer; and
    a dielectric cover layer disposed between the source/drain contact and the cap insulating layer, wherein:
    a first silicide layer is disposed on the source/drain epitaxial layer, and
    a second silicide layer different from the first silicide layer is disposed on the first silicide layer.

12. The semiconductor device of claim 11, wherein the dielectric cover layer includes silicon nitride.

13. The semiconductor device of claim 12, wherein a thickness of the dielectric cover layer covering the cap insulating layer is in a range from 1 nm to 10 nm.

14. The semiconductor device of claim 11, wherein:
an upper surface of the cap insulating layer includes a recess, and
the dielectric cover layer fully fills the recess.

15. The semiconductor device of claim 11, further comprising a barrier layer between the source/drain contact and the dielectric cover layer.

16. The semiconductor device of claim 15, wherein a part of the barrier layer contacts the second silicide layer.

17. The semiconductor device of claim 11, further comprising:
an etch stop layer disposed on a side face of the gate sidewall spacer layer and the cap insulating layer; and
an interlayer dielectric (ILD) layer disposed between the etch stop layer and the dielectric cover layer.

18. A semiconductor device comprising an n-type FET and p-type FET, wherein:
each of the n-type FET and p-type FET includes:
a fin structure protruding from a semiconductor substrate and including a channel region and a source/drain region having a recess;
a gate structure disposed over the channel region, the gate structure including a gate dielectric layer, a gate electrode layer, a sidewall spacer layer, a cap insulating layer disposed on the gate electrode layer and the sidewall spacer layer;
a source/drain epitaxial layer disposed on the recess of the source/drain region;
a source/drain contact disposed over and in electrical contact with the source/drain epitaxial layer; and
a dielectric cover layer disposed between the source/drain contact and the cap insulating layer, wherein:
an interfacial silicide layer is disposed on the source/drain epitaxial layer,
a first silicide layer is disposed on the interfacial silicide layer,
a second silicide layer different from the first silicide layer is disposed on the first silicide layer, and
a thickness of the interfacial silicide layer of the n-type FET is greater than a thickness of the interfacial silicide layer of the p-type FET.

19. The semiconductor device of claim 18, wherein the first silicide layer is a nickel silicide layer and the second silicide layer is a titanium-nickel silicide layer.

20. The semiconductor device of claim 19, wherein the interfacial silicide layer of the n-type FET includes phosphorous, and the interfacial silicide layer of the p-type FET includes boron.

* * * * *